United States Patent
Enouy et al.

(10) Patent No.: US 11,867,733 B2
(45) Date of Patent: Jan. 9, 2024

(54) SYSTEMS AND METHODS OF SIGNAL ANALYSIS AND DATA TRANSFER USING SPECTROGRAM CONSTRUCTION AND INVERSION

(71) Applicants: Robert William Enouy, Waterloo (CA); Andre John Alfons Unger, Waterloo (CA)

(72) Inventors: Robert William Enouy, Waterloo (CA); Andre John Alfons Unger, Waterloo (CA)

(*) Notice: Subject to any disclaimer, the term of this patent is extended or adjusted under 35 U.S.C. 154(b) by 210 days.

(21) Appl. No.: 17/317,296

(22) Filed: May 11, 2021

(65) Prior Publication Data

US 2021/0356502 A1 Nov. 18, 2021

Related U.S. Application Data

(60) Provisional application No. 63/022,852, filed on May 11, 2020.

(51) Int. Cl.
*G01R 23/167* (2006.01)

(52) U.S. Cl.
CPC ................. *G01R 23/167* (2013.01)

(58) Field of Classification Search
CPC ...... G01R 23/167; G06F 17/141; G10L 13/00; G10L 19/00; G10L 19/018; G10L 15/02; G10L 25/18
USPC .......................................................... 702/77
See application file for complete search history.

(56) References Cited

U.S. PATENT DOCUMENTS 10,839,309 B2 * 11/2020 Kokkinis .............. G10L 21/028
2019/0355347 A1 11/2019 Arik et al.

\* cited by examiner

*Primary Examiner* — John H Le
(74) *Attorney, Agent, or Firm* — Bhole IP Law; Anil Bhole; Marc Lampert

(57) ABSTRACT

A method of generating an analytical signal for signal analysis. The method includes obtaining a digital signal, sectioning the digital signal into a series of overlapping windows in time domain, generating a plurality of energy pulses by evaluating a function that describes energy information within each window or set of windows, and generating a time-dependent analytical signal by generating an oscillating signal by multiplying each of the plurality of energy pulses by an oscillating function; and integrating the oscillating function across a band pass frequency filter.

20 Claims, 29 Drawing Sheets

SYSTEMS AND METHODS OF SIGNAL ANALYSIS AND DATA TRANSFER USING SPECTROGRAM CONSTRUCTION AND INVERSION

TECHNICAL FIELD

The present invention relates generally to the field of signal processing; and more particularly, to systems and methods of generating a time-dependent analytical signal from an input signal using spectrogram inversion.

BACKGROUND

Some current approaches conduct signal analysis by applying a Fourier transform on a signal that is solely a function of time and obtaining a "spectrum" of the resulting information that is solely a function of frequency. The method is perfectly reversable via the forward and inverse Fourier transforms. Furthermore, some current approaches to signal analysis proceed by windowing the signal into sections, apply the Fourier transform to each temporal section, and then reconstruct the information as a time-frequency representation or "spectrogram". However, these approaches result in spectrograms that are either discontinuous, irreversible, or both. Although providing some insight into the nature of the signal, the result of this process is a vague representation of the information contained within the signal that may provide a means of communication but cannot generally be used to sufficiently reconstruct the original signal. Thus, providing signal analysis with some built-in limitations.

In an example, data transfer techniques using signal generation, transmission, and processing may apply frequency filtering to isolate and interpret information contained within a signal. This is generally applicable to wireless transmission through cell towers, WIFI, and other radio-based communications. Digital signal transmission of bits using wireless technology generally relies upon the above signal analysis techniques. These techniques generally result in a theoretical upper limit to bitrates for digital transmission In the example of speech recognition, systems generally attempt to identify patterns of phonetic sounds or words as represented by a digitally sampled sound signal. Generally, such approaches can be trained to identify the characteristics of a narrow group of individuals who have provided samples of speech with known meaning, but such approaches may be deficient in attempting to accommodate a wide group of individuals with varying dialects or accents. Moreover, the accuracy of operating on signal data is highly susceptible to background noise. Additionally, some current approaches to synthesize speech take pre-recorded phonetic sounds and words in their digital sound signal form and then concatenate them together to form larger words and sentences. However, when played back as audio, digital sound signals modified in this way may not sound natural, or even audibly human, due to missing characteristics of speech.

SUMMARY

In one aspect, a method of generating an analytical signal for signal analysis is provided, the method executable on one or more computer processors, the method comprising: obtaining a digital signal; sectioning the digital signal into a series of overlapping windows in time domain; generating a plurality of energy pulses by evaluating a function that describes energy information within each window or set of windows; and generating a time-dependent analytical signal by: generating an oscillating signal by multiplying each of the plurality of energy pulses by an oscillating function; and integrating the oscillating function across a band pass frequency filter.

In a particular case of the method, the analytical signal is defined by a set of parameters including time units, frequency units, origin and range of energy pulse information to be included.

In another case of the method, the band pass frequency filter has a frequency range corresponding to the energy pulse information to be included.

In yet another case of the method, the time-dependent analytical signal is invertible to approximate the digital signal.

In yet another case of the method, the digital signal is generated by discretely sampling an input signal, the input signal being either an analog signal or the analytical signal, wherein the amplitude of each sample is the average energy information of the input signal over a predefined observation time interval.

In yet another case of the method, the function has as its peak a median position and monotonically tends to zero at a finite time and frequency interval from the median position.

In yet another case of the method, the function is one of: a parametric probability density function, a single or set of square functions, and a single or set of triangular functions.

In yet another case of the method, the oscillating function comprises a sine wave having a form of $\sin(2\pi\omega t+\lambda)$, where $\lambda$ is a phase shift variable relative to an absolute time origin, $\omega$ is a frequency variable, and t is a time variable.

In yet another case of the method, sectioning the digital signal allows for identifying, quantifying, and mitigating background/ambient noise from the digital signal prior to evaluating the function.

In yet another case of the method, portions of the oscillating function filtered out by the band pass filter are classified as containing noise and represented by the respective energy pulse information being zero.

In yet another case of the method, the method further comprises: obtaining the analytical signal; sampling the analytical signal to convert the analytical signal into a generated digital signal; sectioning the generated digital signal into a series of overlapping windows; determining a discrete forward Fourier transform of the generated digital signal in each window; and arranging the Fourier transform of each window into a discrete time-frequency energy spectrogram.

In yet another case of the method, the method further comprises applying a phase correction to each discrete component of the discrete time-frequency spectrogram to perform at least one function selected from: adjust a relative time of each window to an absolute time origin of the digital signal, rotate a complex valued discrete component to be real-valued in magnitude, and correct a polarity of discrete components that exhibit a negative real value.

In yet another case of the method, the method further comprises converting the discrete time-frequency spectrogram into an analytical spectrogram by identifying a location and an amplitude of each local maximum in the time-frequency domain of the discrete time-frequency spectrogram, where each maximum is representative of a single one of the energy pulses.

In yet another case of the method, converting the discrete time-frequency spectrogram into the analytical spectrogram further comprises performing least-squares optimization to estimate parameters of a parametric function for each energy pulse to obtain a best fit with each local maximum from the discrete time-frequency spectrogram, wherein a function representing the sum of all parametric functions represents the analytical spectrogram.

In another aspect, a system for generating an analytical signal for signal analysis is provided, the system comprising one or more processors and one or more computer storage media, the one or more computer storage media causing the one or more processors to execute a set of programmable modules configured to: obtain a digital signal; section the digital signal into a series of overlapping windows in time domain; generating a plurality of energy pulses by evaluating a function that describes energy information within each window or set of windows; and generate a time-dependent analytical signal by: generating an oscillating signal by multiplying each of the plurality of energy pulses by an oscillating function; and integrating the oscillating function across a band pass frequency filter.

In a particular case of the system, the analytical signal is defined by a set of parameters including time units, frequency units, origin and range of energy pulse information to be included.

In a particular case of the system, the band pass frequency filter has a frequency range corresponding to the energy pulse information to be included.

In a particular case of the system, the time-dependent analytical signal is invertible to approximate the digital signal.

In a particular case of the system, the digital signal is generated by discretely sampling an input signal, the input signal being either an analog signal or the analytical signal, wherein the amplitude of each sample is the average energy information of the input signal over a predefined observation time interval.

In a particular case of the system, the function has as its peak a median position and monotonically tends to zero at a finite time and frequency interval from the median position.

In a particular case of the system, the function is one of: a parametric probability density function, a single or set of square functions, and a single or set of triangular functions.

In a particular case of the system, the oscillating function comprises a sine wave having a form of $\sin(2\pi\omega t+\lambda)$, where $\lambda$ is a phase shift variable relative to an absolute time origin, $\omega$ is a frequency variable, and t is a time variable.

In a particular case of the system, portions of the oscillating function filtered out by the band pass filter are classified as containing noise and represented by the respective energy pulse information being zero.

In a particular case of the system, sectioning of the digital signal identifies, quantifies, and mitigates background/ambient noise from the digital signal prior to evaluation of a function that describes the noiseless analytical signal.

In a particular case of the system, the programmable modules are further configured to: obtain the analytical signal; sample the analytical signal to convert the analytical signal into a generated digital signal; section the generated digital signal into a series of overlapping windows; determine a discrete forward Fourier transform of the generated digital signal in each window; and arrange the Fourier transform of each window into a discrete time-frequency energy spectrogram.

In a particular case of the system, the programmable modules are further configured to apply a phase correction to each discrete component of the discrete time-frequency spectrogram to perform at least one function selected from: adjust a relative time of each window to an absolute time origin of the digital signal, rotate a complex valued discrete component to be real-valued in magnitude, and correct a polarity of discrete components that exhibit a negative real value.

In a particular case of the system, the programmable modules are further configured to convert the discrete time-frequency spectrogram into an analytical spectrogram by identifying a location and an amplitude of each local maximum in the time-frequency domain of the discrete time-frequency spectrogram, where each maximum is representative of a single one of the energy pulses.

In a particular case of the system, the programmable modules are further configured to convert the discrete time-frequency spectrogram into the analytical spectrogram further comprises performing least-squares optimization to estimate parameters of a parametric function for each energy pulse to obtain a best fit with each local maximum from the discrete time-frequency spectrogram, wherein a function representing the sum of all parametric functions represents the analytical spectrogram.

In an aspect, there is provided a method of generating a time-dependent analytical signal from an input signal, the input signal comprising an analog or analytical signal, the method executable on one or more computer processors, the method comprising: receiving the input signal; determining a digital spectrogram for the input signal; determining energy pulses in a time-frequency domain for the analytical spectrogram, each energy pulse determined by evaluating a parametric function spanning a defined interval of the analytical spectrogram; determining a time-dependent analytical signal by aggregating the energy pulses, aggregating the energy pules comprises integration of a multiplication of the energy pulses by an oscillating function in a time-frequency domain across a band pass frequency filter, the frequencies inclusive in the band pass filter comprising the determined energy pulses; and outputting the time-dependent analytical signal.

In a particular case of the method, the probability density function for each pulse comprises a defined median position, and scale.

In another case of the method, the oscillating function comprises a sine wave having a form of $\sin(2\pi\omega t+\lambda)$, where $\lambda$ is a phase shift variable relative to an absolute time origin, $\omega$ is a frequency variable, and t is a time variable.

In yet another case of the method, each energy pulse represents a unit of information, and collectively convey a concept.

In yet another case of the method, the method further comprising: receiving the analytical signal; sampling the analytical signal to convert the analytical signal into a digital signal; sectioning the digital signal into a series of overlapping windows; determining a discrete forward Fourier transform of the digital signal data in each window; and arranging the Fourier transform of each sequential window into a discrete time-frequency energy spectrogram.

In yet another case of the method, the method further comprising zero padding a first window and a last window in the series of overlapping windows.

In yet another case of the method, the method further comprising zero padding the front of each window.

In yet another case of the method, the method further comprising applying a phase correction to each discrete component of the digital spectrogram to, at least one of, adjust a relative time of each window to an absolute time origin of the digital signal, rotate a complex valued discrete component to be real-valued in magnitude, and correct a polarity of discrete components that exhibit a negative real value.

In yet another case of the method, the method further comprising converting a digital spectrogram of the digital signal into an analytical spectrogram by identifying a location and an amplitude of each local maximum in the time-frequency domain of a digital spectrogram of the digital signal, where each maximum is representative of a single one of the energy pulses.

In yet another case of the method, converting the digital spectrogram of the digital signal into the analytical spectrogram further comprising performing least-squares optimization to estimate parameters of a parametric function for each energy pulse to obtain a best fit with each local maximum from the digital spectrogram, wherein a function representing the sum of all parametric functions represents the analytical spectrogram.

In another aspect, there is provided a system of generating a time-dependent analytical signal from an input signal, the input signal comprising an analog or analytical signal, the system comprising one or more processors and one or more computer storage media, the one or more computer storage media causing the one or more processors to execute: an input module to receive the input signal; an analytical spectrum module to: determine an analytical spectrogram for the input signal; determine energy pulses in a time-frequency domain for the analytical spectrogram, each energy pulse determined by evaluating a parametric function spanning a defined interval of the analytical spectrogram; and determine a time-dependent analytical signal by aggregating the energy pulses, aggregating the energy pules comprises integration of a multiplication of the energy pulses by an oscillating function in a time-frequency domain across a band pass frequency filter, the frequencies inclusive in the band pass filter comprising the determined energy pulses; and an output module to output the time-dependent analytical signal.

In a particular case of the system, the probability density function for each pulse comprises a defined median position, and scale.

In another case of the system, the oscillating function comprises a sine wave having a form of $\sin(2\pi\omega t+\lambda)$, where $\lambda$ is a phase shift variable relative to an absolute time origin, $\omega$ is a frequency variable, and $t$ is a time variable.

In yet another case of the system, each energy pulse represents a unit of information.

In yet another case of the system, the one or more processors further executing a digital signal module to: receive the analytical signal; sample the analytical signal to convert the analytical signal into a digital signal; section the digital signal into a series of overlapping windows; determine a discrete forward Fourier transform of the digital signal data in each window; and arrange the Fourier transform of each sequential window into a discrete time-frequency energy spectrogram.

In yet another case of the system, the digital signal module further zero pads a first window and a last window in the series of overlapping windows.

In yet another case of the system, the digital signal module further zero pads the front of each window.

In yet another case of the system, the digital signal module further applies a phase correction to each discrete component of the digital spectrogram to, at least one of, adjust a relative time of each window to an absolute time origin of the digital signal, rotate a complex valued discrete component to be real-valued in magnitude, and correct a polarity of discrete components that exhibit a negative real value.

In yet another case of the system, the one or more processors further executing a digital spectrogram module to convert a digital spectrogram of the digital signal into an analytical spectrogram by identifying a location and an amplitude of each local maximum in the time-frequency domain of a digital spectrogram of the digital signal, where each maximum is representative of a single one of the energy pulses.

In yet another case of the system, converting the digital spectrogram of the digital signal into the analytical spectrogram further comprising performing least-squares optimization to estimate parameters of a parametric function for each energy pulse to obtain a best fit with each local maximum from the digital spectrogram, wherein a function representing the sum of all parametric functions represents the analytical spectrogram.

In another aspect, there is provided a method of synthesizing, packaging, and transmitting information using signals, the method executable on one of more computer processors, the method comprising: attributing an energy pulse in the time-frequency space of an analytical spectrogram to represent a unit of information, where an energy pulse is represented by an analytical probability density function spanning a finite interval of time and frequency, and where the probability density function has characteristic amplitude, location (median position), scale (standard deviation), and shape (parameters of the parametric probability density function); arranging within a specific time interval and frequency interval, or band, of an analytical spectrogram a set of energy pulses to represent multiple units of information, which collectively convey a concept; performing a definite integration from the lower to the upper frequency bounds of the band containing the multiple energy pulses of information within the analytical spectrogram, producing an analytical signal over the specific time interval containing the multiple pulses of information; outputting the analytical signal.

In another aspect, there is provided a method of digital signal analysis, the method executable on one or more computer processors, the method comprising: receiving an analytical signal and sampling it into a digital signal; in some cases, normalizing and filtering the digital signal; sectioning the normalized and filtered digital signal into a series of overlapping windows wherein the first window and the last window may be zero padded; in some cases, zero padding the front of each window except those points which represent new information; determining a discrete forward Fourier transform of the digital signal data in each window; arranging the Fourier transform of each sequential window into a discrete "digital" time-frequency energy spectrogram and determining, in some cases, a finite difference representation of each discrete Fourier transform value, for each frequency value, with respect to the relative time difference between adjacent windows, outputting a discrete digital spectrogram; in some cases, applying a phase correction to each discrete component of the digital spectrogram to: adjust from the relative time of each window to the absolute time origin of the digital signal; rotating the complex valued discrete component into only being real valued in magnitude; and correcting the polarity of any discrete components the exhibit a negative real value so that the discrete components are positive real valued in magnitude.

In another aspect, there is provided a method of converting a digital spectrogram into an analytical spectrogram, the method executable on one or more computer processors, the method comprising: identifying the location and amplitude of all local maxima in a time-frequency domain of a digital spectrogram, where each maximum can be represented by a single energy pulse; in some cases, using an initial estimate for a shape of the energy pulse and standard deviation in both frequency and time, such that the combination of location, amplitude, shape, and standard deviation prescribe the initial estimate for fitting the digital energy; in some cases, performing least-squares optimization to estimate parameters of each parametric function for each energy pulse in order to obtain a best fit with each local maximum from the digital spectrogram, where the parameters capture the location, amplitude, scale and shape of the energy pulse in time and frequency; determining a function representing a sum of all parametric functions, which represent distinct energy pulses, as a analytical spectrogram.

In another aspect, there is provided a method of using digital binary digit or "bit" data for information synthesis, packaging, transmission, and decoding, the method executable on one or more computer processors, the method comprising: attributing a unit of information to be a digital bit of data; synthesizing information by arranging groups of bits into prearranged packets of data, for example, 8 bits to produce a byte (or any other suitable collecting of bits, such as 16, 32, 64, or the like), where the packet occupies an interval of time and frequency of the analytical spectrogram, and each bit has a codec-specified median position, standard deviation, and shape; locating energy pulses associated with each digital bit at a given position, scale, and shape and turned on with unit amplitude to represent a bit value of "1" and zero amplitude to represent a value of "0"; performing a definite integration from a lower to an upper frequency interval of the packet of data within the analytical spectrogram, producing an analytical signal or packet signal over the specific time interval containing the packet of information; transmitting the analytical signal; receiving the analytical signal and sampling it into a digital packet signal; analyzing the digital signal to construct a digital spectrogram which contains the energy information within the digital signal; using the same codec employed to construct the original "packet" signal, decode the information by examining all median locations in the time-frequency interval spanned by the packet of data and determine whether each median location exhibits local maxima in the digital spectrogram and hence represents a "1" or whether it does not exhibit a local maximum and represents a "0".

A method of speech synthesis, the method executable on one of more computer processors, the method comprising: attributing a unit of information to be an energy pulse emanating from a single component of a human voice apparatus; synthesizing information by arranging multiple energy pulses into a set of pulses, where the set of pulses occupies an interval of time and frequency of the analytical spectrogram, and each pulse in the set has a specified median position, amplitude, standard deviation, and shape, and collectively the set represents a phoneme of human speech; modulating the specified median position, amplitude, standard deviation, and shape of all, or some of, the energy pulses that collectively represent the phoneme to concatenate multiple phonemes together into phoneme combinations, such as words, and further to introduce intonation, inflection, phrasing, and expression into the progression of phonemes as words, as well as in transitions between phonemes and words into a sentence; performing a definite integration from the lower to the upper frequency interval of the set of energy pulses within the analytical spectrogram, producing an analytical signal over the specific time interval containing the phoneme, word, or sentence of information; transmitting the analytical signal or digitally sampling the analytical signal for storage.

In another aspect, there is provided a method of removing background noise from a signal, the method executable on one of more computer processors, the method comprising: receiving an analog signal and digitally sampling the analog signal, or receiving a digital signal, where the digital signal is pre-recorded, or the digital signal represents output from a receiver, such as a microphone, that was used to receive and digitally sample a signal; constructing a digital spectrogram of the digital signal; in some cases, establishing a noise threshold value, which could be static, variable, or even dynamically assisted by an artificial agent, to differentiate ambient noise from potentially important information, such as human speech; identifying background or ambient signal noise under controlled conditions, quantifying the average energy persistence within the spectrogram relating to background noise, which may include energy expressions at specific frequencies; removing digital information relating to background from each time and frequency interval within the digital spectrogram, and in some cases using subtraction, and in yet others using multiplication, to scale the total energy information within time-frequency intervals to remove the persistence of background energy; constructing an analytical spectrogram to be consistent with the digital spectrogram after removing the background noise; performing a definite integration from a lower to an upper frequency interval of the set of energy pulses within the analytical spectrogram, producing an analytical signal over the specific time interval containing the phoneme, segment, word, or sentence of information; transmitting the analytical signal or digitally sampling the analytical signal for storage.

In another aspect, there is provided a method of speech recognition, the method executable on one of more computer processors, the method comprising: receiving an analog human voice signal or alternatively a signal synthesized and digitally sampling the analog signal, or receiving a digitized human voice signal, where the digital signal is pre-recorded, or the digital signal represents output from a microphone that was used to receive and digitally sample an analog human voice signal; constructing a digital spectrogram of the digital signal; in some cases, removing background noise from the digital spectrogram; constructing an analytical spectrogram from the digital spectrogram information; identifying patterns within the analytical spectrogram in which the human voice information resides; matching identified patterns within the analytical spectrogram with known spoken phonemes under controlled conditions to create a training data set; utilizing a machine learning algorithm with the training data set to classify information in digital and analytical spectrograms as spoken phonemes or words.

In another aspect, there is provided a method of generating an obfuscating layer over a signal for encoding purposes, the method executable on one of more computer processors, the method comprising: receiving and digitally sampling an analog signal, or receiving a digital signal from a computer system, where the digital signal is pre-recorded, or the digital signal represents output from a receiver, such as a microphone, that was used to receive and digitally sample a signal; constructing a digital spectrogram of the digital signal; constructing a predefined codec using an analytical spectrogram containing digital bits positioned to overlay important information in the digital spectrogram of the received signal; producing an analytical signal over the specific time interval containing the packet of information within the analytical spectrogram; digitally sampling the analytical signal to produce a digital packet signal; overlaying the analytical signal and adding it to the received signal, and normalizing the signal, to encode the received digital signal by creating an obfuscating layer with the analytical spectrogram comprising the digital packet signal; transmitting the signal or storing the digital signal; receiving and digitally sampling the analog signal; reproducing the analytical obfuscating signal layer using a predefined codec and subtracting the resulting signal from the received or stored signal to recover, or decode, the original information.

These and other aspects are contemplated and described herein.

It will be appreciated that the foregoing summary sets out representative aspects of systems and methods and assists skilled readers in understanding the following detailed description.

DESCRIPTION OF THE DRAWINGS

A greater understanding of the embodiments will be had with reference to the Figures, in which.

DETAILED DESCRIPTION

Figure 1:
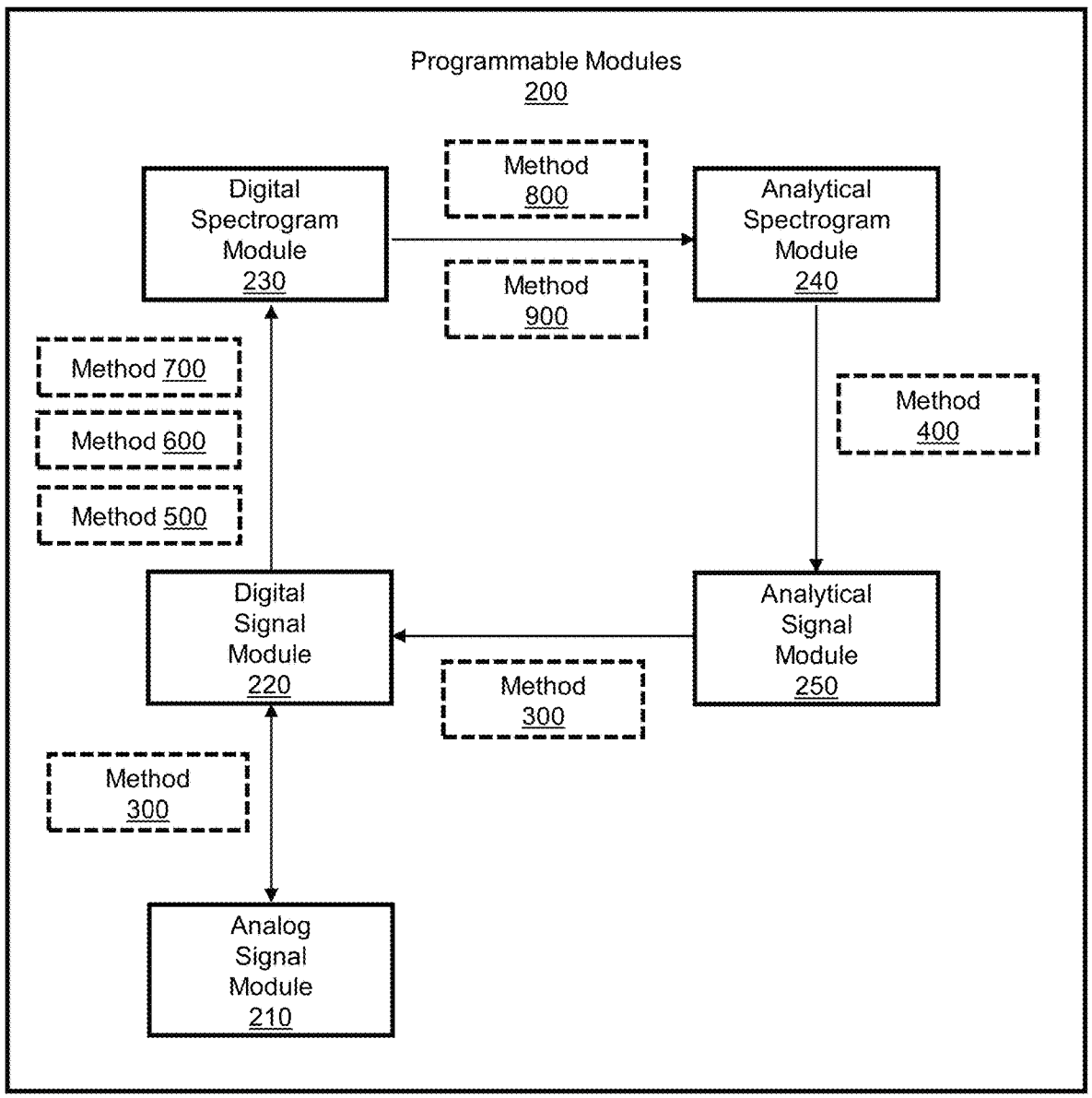
FIG. 1 illustrates a flow diagram of programmable modules and methods performed by each respective module.

Embodiments will now be described with reference to the figures. For simplicity and clarity of illustration, where considered appropriate, reference numerals may be repeated among the figures to indicate corresponding or analogous elements. In addition, numerous specific details are set forth to provide a thorough understanding of the embodiments described herein. However, it will be understood by those of ordinary skill in the art that the embodiments described herein may be practiced without these specific details. In other instances, well-known methods, procedures, and components have not been described in detail so as not to obscure the embodiments described herein. Also, the description is not to be considered as limiting the scope of the embodiments described herein.

Any module, unit, component, server, computer, terminal, or device exemplified herein that executes instructions may include or otherwise have access to computer readable media such as storage media, computer storage media, or data storage devices (removable and/or non-removable) such as, for example, magnetic disks, optical disks, or tape. Computer storage media may include volatile and non-volatile, removable, and non-removable media implemented in any method or technology for storage of information, such as computer readable instructions, data structures, program modules, or other data. Examples of computer storage media include RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which can be used to store the desired information, and which can be accessed by an application, module, or both. Any such computer storage media may be part of the device or accessible or connectable thereto. Any application or module herein described may be implemented using computer readable/executable instructions that may be stored or otherwise held by such computer readable media.

The following disclosure relates generally to the field of signal processing; and more particularly, to systems and methods of signal analysis by synthesizing or decoding information within a spectrogram and inverting the spectrogram into a signal. Further, the following disclosure is directed to systems and methods of synthesis, modification, transmission and decoding of high-density bit data within a signal. Further, the following disclosure is directed to systems and methods of recognition and synthesis of human speech communication. Generally, embodiments of the present disclosure take advantage of the premise that transient waves of information within a signal can be intercepted, measured, and then disaggregated into energy pulses occurring within a specific time and frequency interval of a spectrogram to quantify how these energy pulses come into existence, persist, and ultimately dissipate. The information contained within, and therefore expressed by, these same energy pulses can then be modified and converted back into a signal for subsequent transmission.

Generally, various approaches use the idea that an analog or analytically defined signal is the starting point for digital sampling, analysis, and interpretation of any enclosed information. In contrast, the present disclosure provides methods and systems that are configured to provide an entry point for information that is provided as an analog signal, an analytical signal or a digital signal, and to interpret the entered information for conversion to the other domains. Thus, embodiments of the present disclosure are inspired by a full life-cycle interpretation of information, exemplified as programmable modules 200 in FIG. 1, and thus, identifies the analog signal as an intermediary state of transmission from a source to a receiver. Such life-cycle interpretation of information can begin with a set of time-ordered frequency-specific analog energy pulses synthesized within a domain dimensioned by orthogonal time and frequency axes, where this energy information is used to express an idea. Note that the time-frequency domain can be like other definitions of a spectrogram to the degree that both are dimensioned by a horizontal time and vertical frequency axis; the information they contain may vary.

A simplified example to provide background context is a note played on a guitar:
  The guitar string is physically constrained to produce information over a small frequency range. This physical process is like selecting an incremental frequency interval in the time-frequency domain.
  The musician provides energy to the guitar string by plucking it at a point in time. This causes the string to begin vibrating at its prescribed frequency and later stop vibrating as the energy dissipates. The energy input into a specific frequency translates into the volume of the note played, with more energy producing a higher volume. This is analogous to populating an interval of the time-frequency domain with an energy pulse consisting of non-zero coefficients spanning the time interval and frequency at which the string vibrates.
  The vibrating guitar string encounters resistance from the surrounding environment, which causes concussive energy pulses to form in the air and travel away from the source as an analog signal. There is a conservation of energy between the vibration of the guitar string after plucking and the energy in the signal.
  The analog signal is created as a combination or aggregation of information originally synthesized as analog energy pulses in the time-frequency domain. The complexity of the signal is a function of the time sequence and overlap in which energy pulses at specific frequencies (notes) and energy (volume) are synthesized and then dissipate in the time-frequency domain, resulting in a signal that could be easy or difficult to interpret.
  An observer or receiver can intercept and sample the analog signal converting it into a digital signal, perform digital signal analysis to generate a digital spectrogram, and identify the transmitted energy patterns using the digital spectrogram. In this example, the energy pattern would be the note played on a guitar at a particular interval in time, and at a specific volume and frequency.

In the above example, the analog signal transmission can be interpreted as an intermediary step between the synthesis and analysis of the information. The guitar is the source of the time-ordered and frequency-ordered information in the time-frequency domain, the ambient air is the medium that relays identifiable information to an audience as concussive energy pulses in the form of a signal, and the audience receives and analyzes the information conveyed by the signal. The above example provides a framework, algorithm, and application to quantify the processes whereby energy information is conserved as it is converted between the time-frequency domain and the signal as a continuously differentiable and reversible operation.

Without loss of generality, the present embodiments inventively provide a full life-cycle interpretation of information through a method and system that can both conduct signal analysis on a digital or analog signal to decode information within the signal, or alternatively accept an analytical signal or parameters describing an analytical signal for synthesis into a digital or analog signal for subsequent transmission.

In the above example of the guitar string, a member of the audience could use the present embodiments to conduct signal analysis by receiving a recording of the analog signal of the guitar music played and inputting the analog signal to programmable modules 200. In this case, the analog signal is sampled into a digital signal. Signal analysis is then conducted via windowing the digital signal, constructing a time-frequency digital spectrogram of the window information, and phase-shifting the digital spectrogram relative to the time origin of the received analog signal. The resulting digital spectrogram can be stored. The time-frequency location of energy pulses within the digital spectrogram then depicts the progression of notes played by the musician.

Staying with the above example, the musician may wish to edit the recording of themselves playing and subsequently then mix it with additional sound information to construct a new recording. The musician could begin by taking the digital spectrogram of the recording, remove any unwanted background or audience noise and convert it to an analytical spectrogram, which is a time and frequency continuous representation of the discrete digital spectrogram. The present embodiments can be instructed to remove or adjust existing energy pulses within the analytical spectrogram, or even synthesize new energy pulses representing musical notes (information) into the same analytical spectrogram. The analytical spectrogram can be inverted into an analytical signal. This analytical signal could be sampled and transmitted to an audience or sampled into a digital recording. Note the distinction between the analog signal and the analytical signal. The analog signal was received from the musician playing their guitar while the analytical signal was constructed by synthesizing information into a time-frequency continuous analytical spectrogram and inverting that information into an analytical signal.

Advantageously, the present embodiments allow for the use and modification of a received signal's spectrogram and provides for the ability to invert that spectrogram back into a digital signal; for example, such that it can be communicated to another receiver for analysis.

While the present embodiments are discussed in the context of sound information, the subject matter described herein is applicable to any application that synthesizes packets of information in the time-frequency domain, and then performs spectrogram inversion to generate a signal for subsequent transmission of these packets through wired or wireless technology to be received and analyzed by a device. For the foregoing reasons, a skilled reader will appreciate that the present embodiments are suitable for data transfer applications in general.

Advantageously, the embodiments described herein overcome significant technical challenges in the art of spectrogram inversion. Other approaches generally include incomplete phase information, causing the production of discontinuities within a digital signal reproduced from a digital spectrogram. Embodiments of the present disclosure permit seamless transition of information between the spectrogram domain and the signal. Specifically, definite integration of the analytical spectrogram over a frequency interval collapses the time-frequency dimensionality of energy pulses within the spectrogram into the time-only dimensionality of a signal. The resulting analytical signal produces a parametric representation wholly with respect to time and can be measured at any sampling rate. The spectrogram inversion approach presented herein provides a foundation, for example, for generating a carefully designed analytical signal to replicate human speech characteristics or to perform high-density information packing for data transfer.

Advantageously, the embodiments described herein overcome significant technical challenges in the art of spectrogram construction. In some embodiments, a digital signal is selected for numerical analysis. In some cases, the front end and back end of the digital signal are zero-padded to ensure the first and last windows contain no energy information. In some cases, observation windows can be shifted and overlapped along a temporal length of the digital signal to, for example, observe the appearance, persistence, and subsequent dissipation of signal information between consecutive windows; and, to construct a digital spectrogram representation of the signal in both time and frequency. In some cases, a backwards finite difference of information energy can be formed or judiciously estimated with respect to time to produce a digital spectrogram representation describing energy changes at all frequencies, which allows this analysis to quantify the appearance, persistence, and subsequent dissipation of information energy throughout the entirety of any digital signal. In some cases, the digital spectrogram is then phase shifted from the relative time of each sampling window to the absolute time origin of the input digital signal. Additionally, the digital spectrogram is further phase shifted so that all digital spectrogram entries are only real valued and positive in magnitude, thereby representing energy pulses as units of information.

Advantageously, the embodiments described herein provide an approach for numerical analysis to inform the parameterization of functions that construct an equivalent analytical spectrogram to that of any input digital spectrogram. Once described, these parameters can be modified to dynamically change and effect any desired influence on the nature of energy information within the analytical spectrogram, wherein this same energy information is then inverted into an analytical signal. In the case of replicating a phonetic sound within human speech, these changes could include intonation, emotion, dialect, and phrasing or could include the transition of one phonetic sound into another during expression of a multi-syllabic word. In the case of sound analysis, the outcome of the approach is to provide a strategy to implement natural speech recognition and synthesis by identifying patterns within the digital spectrogram, replicating those patterns with parametric functions within an analytical spectrogram as part of speech recognition, of further inverting the synthesized information into an analytical signal as part of speech synthesis. The numerical approaches can provide feedback control that allows replication of human speech characteristics by iteratively comparing a synthesized trial speech signal with a target recorded signal. In the case of data packaging and transmission, the outcome of this approach can be used to efficiently store bit information within a signal and recapture this bit information upon reception and analysis. In another application, the techniques described herein could generate an obfuscating layer of encoded energy to mask an underlying signal, which could only be recovered with a priori knowledge of the codec.

Embodiments of the present disclosure advantageously interpret a signal as an intermediary transmission step. Thus, a spectrogram within the time-frequency domain can be interpreted as the origin of information synthesis leading to a signal as a means of information transmission. This is generally in contrast to other approaches used to describe Fourier analysis such as: the "forward Fourier transform" which is used to transform a digital signal that is solely a dependant on time into a related function that is solely dependent on frequency; and the "inverse Fourier transform" which is used to transform energy information that is solely dependent on frequency back into a digital signal that is solely dependent on time. These terms imply that the digital signal, as derived by receiving and sampling a signal, is the starting point for analysis. Given that the time-frequency domain is the origin of information, and that the information is transmitted as time-ordered and meaningful patterns through signals, the information patterns in the time-frequency domain can be generally considered smooth and have continuously differentiable functions with respect to time and frequency.

Figure 2:
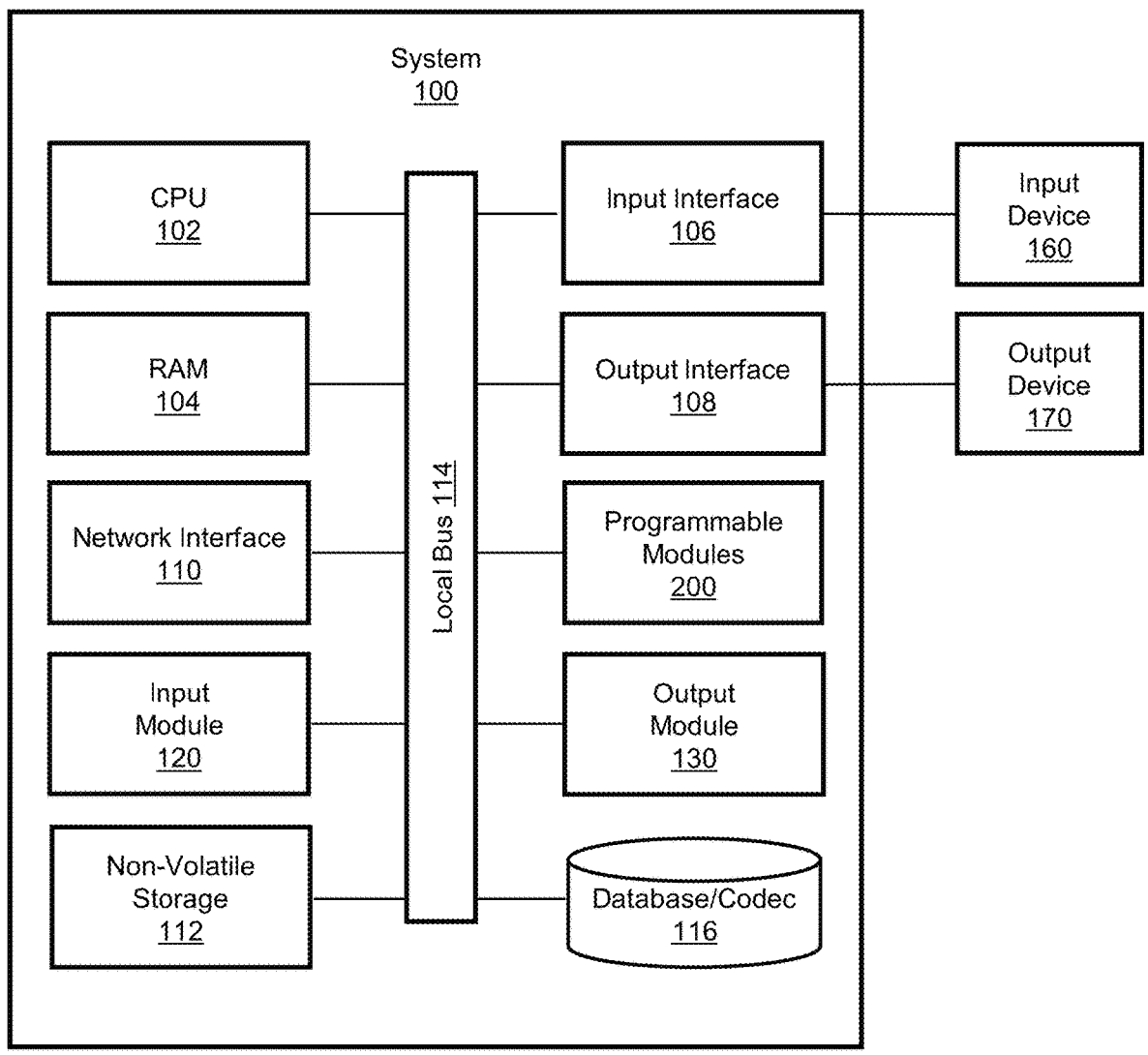
FIG. 2 is a schematic diagram showing the system of FIG. 1, in accordance with an embodiment.
Figure 3:
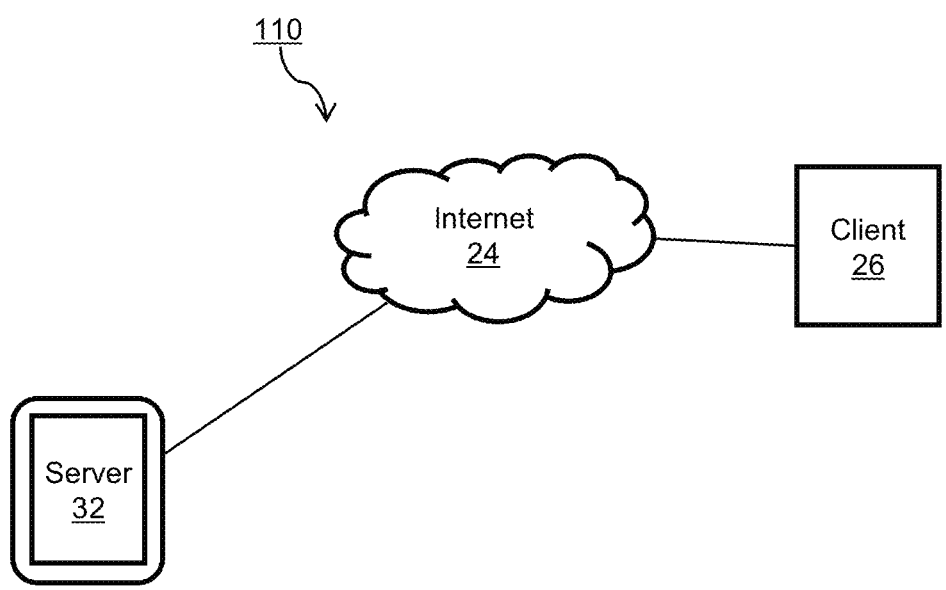
FIG. 3 is a schematic diagram showing the system of FIG. 2 in an exemplary operating environment.

Referring now to FIG. 2 and FIG. 3, shown are a system 100, in accordance with an embodiment, and a computing environment, respectively. In this embodiment, the system 100 is run on a client-side device 26 and, in some cases, can access content or computing resources located on a server 32 over a network 24, such as the internet. In further embodiments, the system 100 can be run on any other computing device; for example, a desktop computer, a laptop computer, a smartphone, a tablet computer, the server 32, a smartwatch or other wearable computing device, distributed or cloud computing device(s), or the like.

In some embodiments, the components of the system 100 are stored by and executed on a single computer system. In other embodiments, the components of the system 100 are distributed among two or more computer systems that may be locally or remotely distributed.

FIG. 2 shows various physical and logical components of an embodiment of the system 100. As shown, the system 100 has several physical and logical components, including a central processing unit ("CPU") 102 (comprising one or more processors), random access memory ("RAM") 104, an input interface 106, an output interface 108, a network interface 110, non-volatile storage 112, and a local bus 114 enabling CPU 102 to communicate with the other components. CPU 102 executes an operating system, and various modules, as described below in greater detail. RAM 104 provides relatively responsive volatile storage to CPU 102. The input interface 106 can interact with and receive data and signals from various devices, such as an audio input signal from an audio or bit input device 160 (e.g., microphone). The input interface 106 can also enable an administrator or user to provide input via an input device, for example a keyboard and mouse. In other cases, the audio sensor data can be already located on the database 116 or received via the network interface 110. The output interface 108 can outputs data to output devices, for example, to an audio or bit output device 170 (e.g., speaker). The network interface 110 permits communication with other systems, such as other computing devices and servers remotely located from the system 100, such as for a typical cloud-based access model. Non-volatile storage 112 stores the operating system and programs, including computer-executable instructions for implementing the operating system and modules, as well as any data used by these services. Additional stored data, as described below, can be stored in a database or codec 116. During operation of the system 100, the operating system, the modules, and the related data may be retrieved from the non-volatile storage 112 and placed in RAM 104 to facilitate execution.

In an embodiment, the CPU 102 is configurable to execute a number of conceptual modules, including an input module 120, an output module 130, and a number of programmable modules 200. The programmable modules 200 are illustrated in FIG. 1 and can include an analog signal module 210, a digital signal module 220, a digital spectrogram module 230, an analytical spectrogram module 240, and an analytical signal module 250. In further embodiments, all or a portion of the functions of these modules can be combined on certain modules or executed on other modules, or executed on, or in combination with, other computing devices.

In some cases, the output module 130 can output or transmit an output signal wirelessly using radio waves for cellular, Wi-Fi, Bluetooth, or analogous peer-to-peer data transfer protocol; as acoustic waves through air, or for underwater communication, or through solid media; as light waves through a vacuum, gas or liquid phase, or through solid fibre optic media; as electrons or other particles though gas, liquid or solid phase material.

FIG. 1 illustrates an illustrative flow diagram of an interaction of the programmable modules 200 and illustrates the respective methods performed by each of the programmable modules. It is understood that while the methods are illustrated as separated and performed by a respective programmable module, they can be combined and/or performed on other programmable modules as suitable.

The input module 120 receives and reads an input signal from the input interface 106, the network interface 110, or the database 116. In some cases, to read the input signal, the input module 120 can identify a single channel for input and read integer (or real) data representing signal magnitude as a function time t where the discrete data is denoted as $h(t_n)$ at discrete sampling time $t_n$ [time]. Operating on a single channel is for illustrative purposes and operating on additional channels in parallel is contemplated.

The input module 120 provides multiple entry points of external information, is communicatively linked to the analog signal module 210, digital signal module 220, and analytical spectrogram module 240, and includes suitable logic to direct the received information appropriately. The input module 120 provide a first entry point of external information, an analog signal, to analog signal module 210; a second entry point of external information, a time-dependent digital signal, to digital signal module 220; and a third entry point of external information, energy pulse parameters, to analytical spectrogram module 240. Alternatively, analytical spectrogram module 240 may receive input energy pulse information following internal processing within the programmable modules 200.

Figure 4:
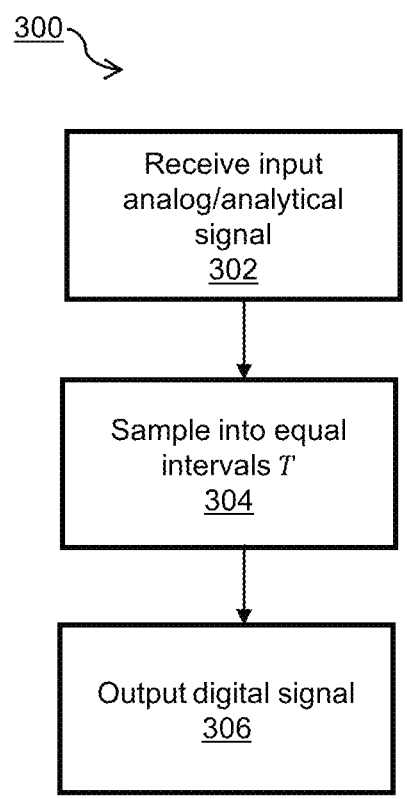
FIG. 4 is a flow chart of a method for receiving and sampling either an analog or analytical input signal for the purpose of generating a digital output signal, in accordance with an embodiment.

As illustrated in FIG. 4, Method 300, performed by the digital signal module 220, receives and samples either an analog or analytical input signal for the purpose of generating a digital output signal.

At block 302 the digital signal module 220 receives either a time-dependant analog signal from module 210 or the time-dependent analytical signal from module 250, depending on whether the inputted signal received from the input module 120 is an analog signal or an analytical signal.

Figure 5:
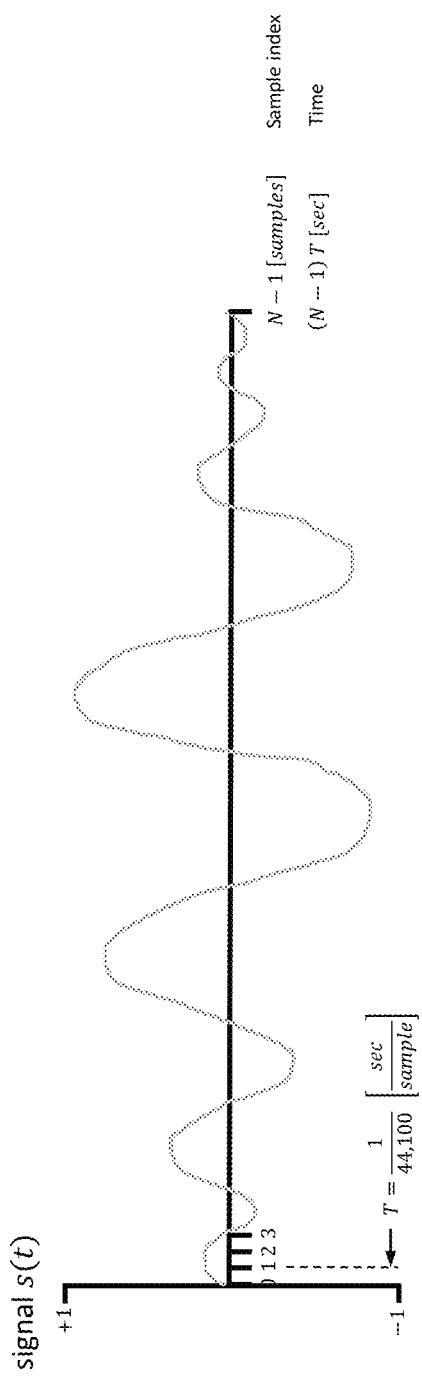
FIG. 5 illustrates an example of an idealized continuous (analog) signal and discrete sampling (digital) of such analog signal.

The digital signal module 220 discretely samples the analog or analytical signal into a time series where: the length of the time series is the observation interval; and the amplitude of each measurement is the average information energy within the signal over a given sampling interval. FIG. 5 illustrates an example of an idealized time-continuous (analog or analytical) signal s(t) as well as a discretely sampled (digital) version of the same signal $h(t_n)$ in the observation interval n=0,1, . . . , N−1. Note that the first data point of the signal is at the origin $t_0$, while the last data point is $t_{N-1}$.

In some cases, the digital signal module 220 can determine, using method 300, properties and operations for the signal to be analyzed. In an example, at block 304, a sampling interval can be determined surrounding time $t_n$ [time] and denoted as $$T\left[\frac{\text{time}}{\text{sample}}\right]$$

where:

$$T = \frac{t_{n+\frac{1}{2}} - t_{n-\frac{1}{2}}}{\left(n+\frac{1}{2}\right) - \left(n-\frac{1}{2}\right)} \quad \text{Equation (1)}$$

Starting at time $t_0$ and ending at time $t_{N-1}$, sampling times for analysis can be such that the data are indexed as $h(t_n)$ where n=0, . . . , N−1 [samples]. Therefore, the digital signal includes N data points and starts at t=0 [time].

To discretely sample the time-continuous analog or analytical signal s(t), at block 302, the input interface 106 receives from the audio or bit input device 160 (such as an audio sensor) an input analog signal. At block 304, the digital signal module 220 performs numerical integration on the analog signal at equally spaced sampling intervals T to average this energy over the sampling interval and generate a digital signal $h(t_n)$. Equation (2) shows a mathematical representation of this digital sampling process:

$$h(t_n) = \frac{1}{T}\int_{n-\frac{1}{2}}^{n+\frac{1}{2}} s(t)dt \quad \text{Equation (2)}$$

Therefore, there is a conservation of information energy between the analog or analytical and digital signals over the time observation interval.

The process of sampling the time-continuous analog or analytical signal s(t) using Equation (2) transforms the embedded information into a discrete digital signal $h(t_n)$ comprised of a set of time-ordered samples n=0,1, . . . , N–1 [samples]. Note that the sampling process can be explicitly denoted with units of "sample". For instance, a standard digital audio file can have 44,100 samples of data $h(t_n)$ in one second of a recording. Therefore, the time-sampling-process ratio would be denoted as $$T = \frac{1}{44,100}\left[\frac{\text{seconds}}{\text{sample}}\right].$$

The time observation interval of the signal would now be: (N–1)·T [seconds].

At block 306, the digital signal module 220 outputs the time dependant digital signal. The digital signal may be utilized by digital spectrogram module 240, as described below, or could be converted to an analog signal by analog signal module 210 using any of the several known digital-to-analog signal conversion techniques.

Figure 6:
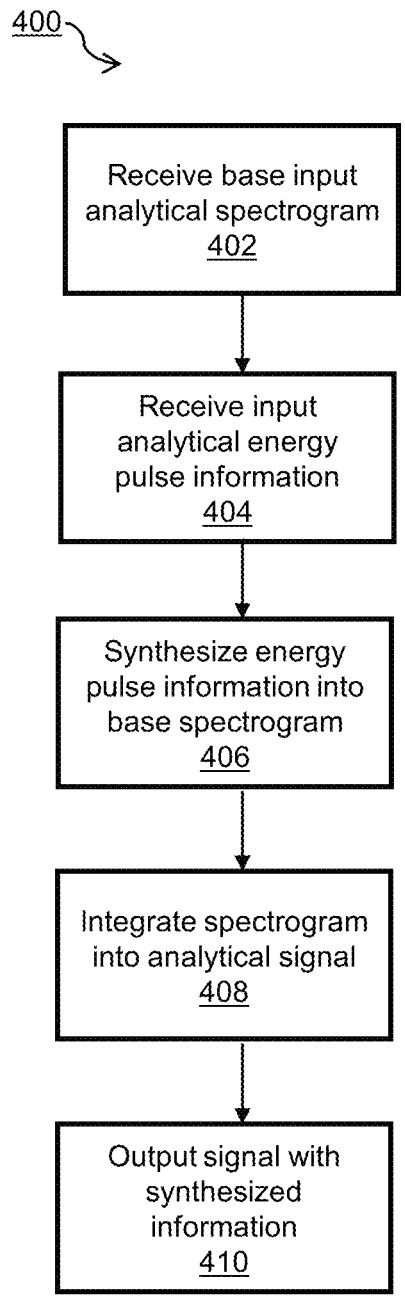
FIG. 6 is a flow chart of a method for inverting an analytical spectrogram into an analytical signal, in accordance with an embodiment.

As illustrated in FIG. 6, method 400, performed by the analytical spectrogram module 240, inverts an analytical spectrogram into an analytical signal. At block 402, the analytical spectrogram module 240 receives a base input analytical spectrogram which includes parameters specifying the time and frequency units, origin, and range to be populated with energy pulse information. These parameters are either generated by the programmable modules 200 when the analytical spectrogram was generated by the digital spectrogram module or can by input from an external source (including, for example, by a user) by the input interface 106. The base input spectrogram does not contain any energy pulse information itself and is initialized everywhere with zero [joules] of energy.

At block 404, the input module 120 receives analytical energy pulse information and directs the input data to analytical spectrogram module 240. For example, the two-dimensional Gaussian function may be used to define an energy pulse $\mathcal{S}(t, \omega)$ as a function of time t [time] and frequency ω [Hz] as:

$$\mathcal{S}(t,\omega) = \frac{1}{2\pi\sigma_t\sigma_\omega}\exp\left\{-a\left(\frac{t-m_t}{\sigma_t}\right)^2 - b\left(\frac{\omega-m_\omega}{\sigma_\omega}\right)^2\right\} \quad \text{Equation (3)}$$

The use of a Gaussian function ensures that the magnitude of the energy pulse tends to zero with increasing distance from the median position ($m_t$, $m_\omega$) subject to scale denoted by standard deviation ($\sigma_t$, $\sigma_\omega$). The amplitude may be adjusted so that the area beneath the Gaussian function equals the desired total energy of the input pulse. In effect, $\mathcal{S}(t, \omega)$ localizes the energy pulse information and controls the resulting signal construction.

The energy pulse $\mathcal{S}(t, \omega)$ can be in the form of a parametric probability density function or a set of parametric probability density functions. A skilled reader will appreciate that the energy pulse $\mathcal{S}(t, \omega)$ may alternatively be in the form of a single or set of parametric square functions, triangular functions, or any other type of function which has as its peak the median position ($m_t$, $m_\omega$) and monotonically tends to zero at a finite time and frequency interval from median position. The parameterization of any function used to replicate an energy pulse serves to characterize its location, scale, shape and amplitude. The area under the function is equal to the total energy within the pulse.

Figure 7A:
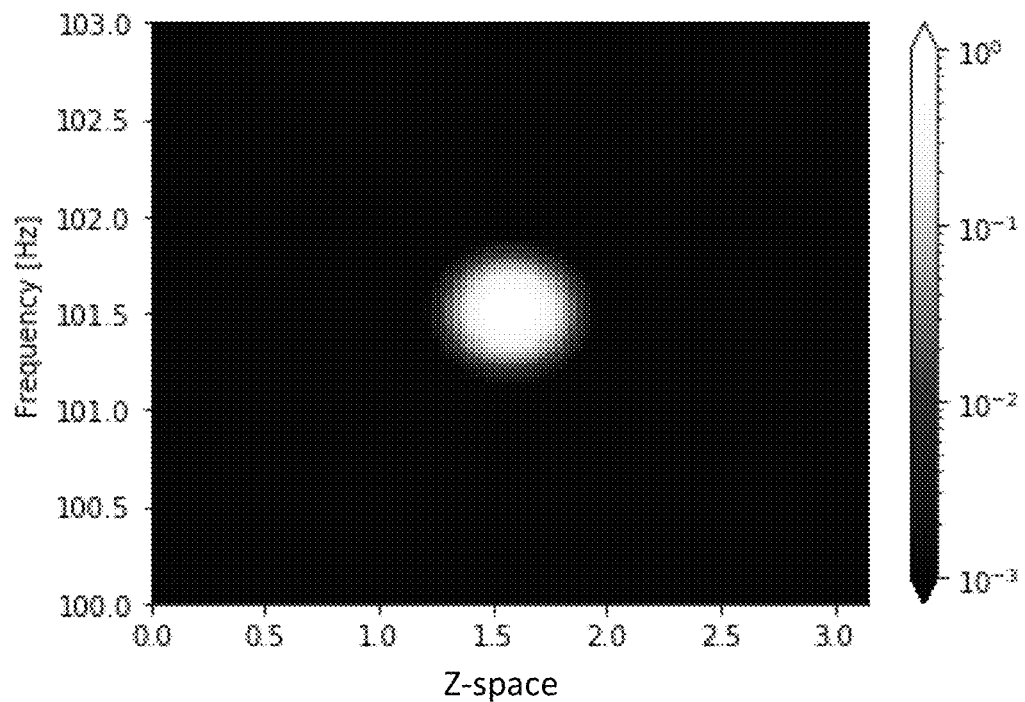
FIG. 7A illustrates an example of a single energy pulse in the time-frequency domain.

FIG. 7A illustrates an example of $\mathcal{S}(t, \omega)$ for an energy pulse representing a single Gaussian function. This energy pulse could represent a unit of information (i.e., a "bit") to be transmitted in a radio signal or any expression of sound or light at a given frequency. The use of input module 120 to direct the energy pulse information directly into the analytical spectrogram module 240 provides a third entry point of external information entry into the programmable modules 200. Alternatively, analytical spectrogram module 240 may receive input energy pulse information following internal processing within the programmable modules 200 of the previously mentioned input analog, analytical, or digital signals.

An analytical expression can be used to describe the energy pulse information $\mathcal{S}(t, \omega)$ as:

$$\mathcal{S}(t,\omega) = \frac{d^2\varepsilon}{d\omega dt} \quad \text{Equation (4)}$$

where $$\frac{d^2\varepsilon}{d\omega dt}[\text{joules}/(\text{time}\cdot\text{frequency})]$$

represents energy distributed as a smooth and continuously differentiable function across the time-frequency domain. Abstracting the energy expression $\mathcal{S}(t, \omega)$ to be a derivative with respect to both time and frequency allows for energy pulse information to smoothly come into existence, persist, and dissipate, while ensuring a continuously differentiable mathematical form. Notably, the derivative $$\frac{d^2\varepsilon}{d\omega dt}$$

can be expressed as having units of joules as the time [sec] and frequency [1/sec] units of the derivative cancel out. This identifies the digital and analytical spectrogram as a careful expression of energy in the frequency-time domain, whereas the digital and analytical signals only represent energy with respect to time. In most cases, the above implies a mathematical definition of a signal $s(t)\equiv\int \mathcal{S}(t, \omega)d\omega$, which may require a suitable definition of an incrementally small observation interval Δt in time and Δω in frequency. Additionally, power $\mathcal{P}(t)$ [joules/time] can be defined as the rate of change of energy ε(t, ω) [joules] with respect to time, which implies a relationship with the signal s(t) as:

$$\mathcal{P}(t) = \frac{d\varepsilon}{dt} \equiv \int \mathcal{S}(t,\omega)d\omega \Rightarrow s(t) \equiv \mathcal{P}(t) \quad \text{Equation (5)}$$

At block 406, the analytical spectrogram module 240 synthesizes the energy pulse information into the base spectrogram. For example, any number of parametric functions representing energy information, such as Equation 5, are evaluated within the base input analytical spectrogram to distribute energy $$\frac{d^2\varepsilon}{d\omega dt}$$

in time and frequency. Alternatively, information within the previously mentioned input analog, analytical, or digital signals may be equivalently represented as energy pulses defined by a set of parametric functions, such as probability density functions, within the analytical spectrogram.

At block 408, to aggregate the unit of information in the time-frequency domain, the analytical spectrogram module 240 applies a signal integrator and signal multiplier, to generate a definite integration of an energy pulse $\mathcal{S}(t, \omega)$ in the analytical spectrogram, multiplied by an oscillating function (such as a sine wave) in the time-frequency domain, producing a time-dependent analytical signal s(t) as:

$$s(t) = \int_{\omega_{min}}^{\omega_{max}} \sin(2\pi\omega t + \lambda)\mathcal{S}(t,\omega)d\omega \quad \text{Equation (6)}$$

where $\omega_{min}$ and $\omega_{max}$ specify a band pass filter via the bounds on the definite integration and $\sin(2\pi\omega t+\lambda)$ provides the correct frequency of vibration for each position within the time-frequency domain. Note that $\lambda$ specifies a phase shift relative to the absolute time origin t=0 [sec]. The definite integration $[\omega_{min}, \omega_{max}]$ reduces the dimensionality of the energy pulse vibration of $\sin(2\pi\omega t+\lambda)\mathcal{S}(t, \omega)$ into a solely time-dependent form as a signal for transmission. Notably, this frequency-based integration operation conserves energy between the analytical spectrogram and the analytical signal. Therefore, any information energy introduced or removed from the spectrogram, and hence the time-frequency domain, naturally adjusts the resulting signal. In some ways, Equation (6) shares a resemblance to the inverse Fourier transform.

The signal construction that results from a single energy pulse described by $\mathcal{S}(t, \omega)$ in Equation (3) for a specific median position $(m_t, m_\omega)$ and scale $(\sigma_t, \sigma_\omega)$ can be analytically derived. A series of integration operations between $[\omega_{min}, \omega_{max}]$ for Equation (6) produces the following signal:

$$s(t) = \frac{2\pi\sigma_t\sigma_\omega}{8\sigma_t\sqrt{\pi b}}\exp\left\{-b\left(\frac{2\pi\sigma_\omega(t-m_t)}{2b}\right)^2 - 2\pi i m_\omega(t-m_t) - i\lambda\right\} \quad \text{Equation (7)}$$

$$\left\{\mathcal{F}(t, \omega_{max})\exp\right.$$

$$\left\{b\left(\frac{\omega_{max}-m_\omega}{\sigma_\omega}\right)^2\right\}\left[\text{erf}\left(\frac{(2b\omega_{max}+2\pi i\sigma_\omega^2(t-m_t)-2bm_\omega)}{(2\sigma_\omega\sqrt{b})}\right)-\right.$$

$$\exp\{4\pi i m_\omega(t-m_t)+i\lambda\}$$

$$\text{erf}\left(\frac{2b\omega_{max}-2\pi i\sigma_\omega^2(t-m_t)-2bm_\omega}{(2\sigma_\omega\sqrt{b})}\right)\right]-\mathcal{F}(t, \omega_{min})\exp$$

$$\left\{b\left(\frac{\omega_{min}-m_\omega}{\sigma_\omega}\right)^2\right\}\left[\text{erf}\left(\frac{2b\omega_{min}+2\pi i\sigma_\omega^2(t-m_t)-2bm_\omega}{(2\sigma_\omega\sqrt{b})}\right)-\right.$$

$$\left.\exp\{4\pi i m_\omega(t-m_t)+i\lambda\}\text{erf}\left(\frac{2b\omega_{min}-2\pi i\sigma_\omega^2(t-m_t)-2bm_\omega}{(2\sigma_\omega\sqrt{b})}\right)\right]\right\}$$

Figure 7B:
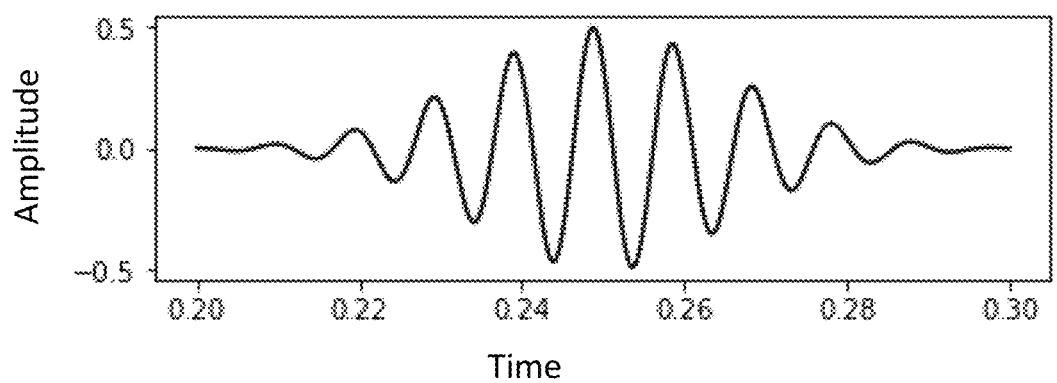
FIG. 7B illustrates an example of a signal for the energy pulse of FIG. 7A.

An example of Equation (7) is illustrated in FIG. 7B, which represents the signal corresponding to a single energy pulse. Note that i is the imaginary number.

At block 410, the analytical spectrogram module 240 outputs the time-dependant analytical signal.

Figure 8:
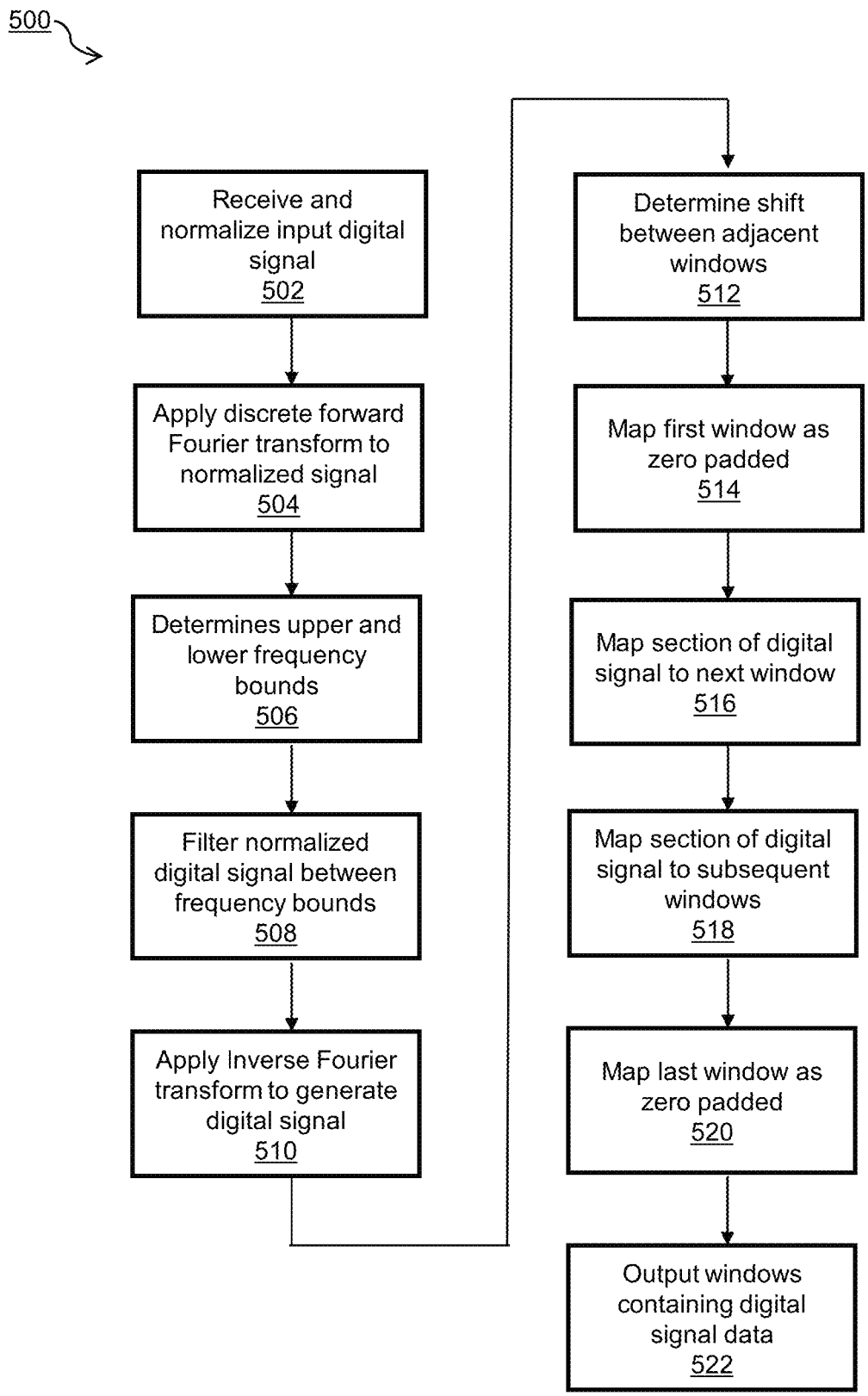
FIG. 8 is a flow chart of a method for windowing digital signal information for spectral analysis, in accordance with an embodiment.

As illustrated in FIG. 8, method 500, performed by the digital spectrogram module 230, windows the digital signal information for spectral analysis. The digital spectrogram module 230 first receives and normalizes and then filters the input signal as a pre-processing step prior to windowing. The discrete forward Fourier transform is applied on the digital signal at specific intervals of time, generating Fourier pairs $$h(t_n) \leftrightarrow H(\omega_k)$$

that can span the entire signal length. Generally, the resolution of this numerical analysis technique is dependent upon the sampling rate, with higher sampling rates providing more resolution when determining where and when energy information exists within a signal. For the purposes of illustration, $h(t_n)$ will be used in the observation interval n=0,1, ..., N−1, where N represents the number of data points within the discrete interval of time.

At block 502, the digital spectrogram module 230 receives the input time-dependant digital signal, which is then normalized such that: $-1 \leq h(t_n) \leq 1$. At block 504, the forward Fourier transform of $h(t_n)$ is determined as:

$$H\left(\frac{j}{NT}\right) = \frac{1}{N}\sum_{n=0}^{N-1} h(nT)e^{-2\pi i n j/N} \text{ for } j = 0, 1, \ldots, N-1 \quad \text{Equation (8)}$$

Note that frequency $$\omega_j = \frac{j}{NT},$$

such that $$H\left(\frac{j}{NT}\right) \equiv H(\omega_j).$$

Additionally, i is the imaginary number.

At block 506, the upper and lower frequency bounds for analysis are determined as $[\omega_{min}, \omega_{max}]$. These values should constrain the input digital signal information of interest within $H(\omega_j)$. At block 508, the input digital signal is filtered as a band-pass signal as:

if $\omega_{min} \leq \omega_j \leq \omega_{max}$ then  Equation (9)

$\hat{H}(\omega_j) = H(\omega_j)$ else $\hat{H}(\omega_j) = 0$ end if

Figure 9:
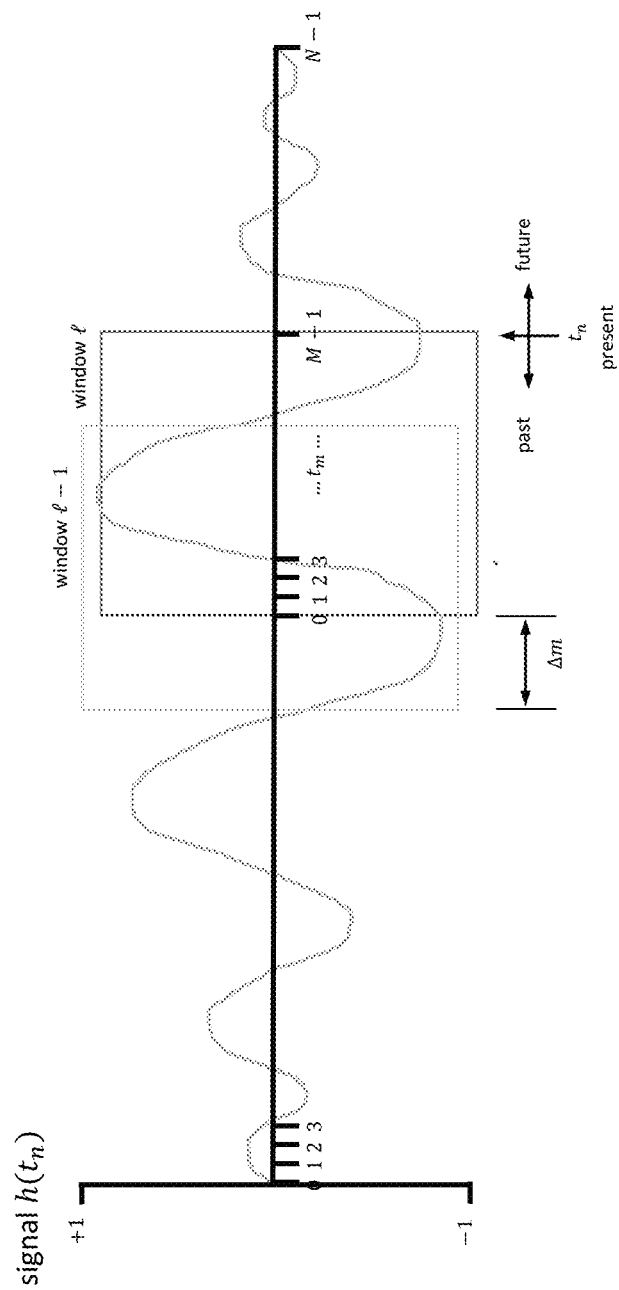
FIG. 9 illustrates an example of overlap windowing on the example signal of FIG. 4.

At block 510, the inverse Fourier transform of $\hat{H}(\omega_j)$ is determined as:

$$\hat{h}(nT) = \sum_{j=0}^{N-1} \hat{H}\left(\frac{j}{NT}\right) e^{2\pi i n j/N} \text{ for } n = 0, 1, \ldots, N-1 \quad \text{Equation (10)}$$

where the resulting filtered signal is now $\hat{h}(t_n)$ and can be used for subsequent analysis, where $nT \equiv t_n$ such that $\hat{h}(nT) \equiv \hat{h}(t_n)$. FIG. 9 depicts an idealized filtered sound signal $\hat{h}(t_n)$, for example, for illustrating notation. Note that the Equation (8) and Equation (10) are shown for illustrative purposes and used to specify the forward and inverse discrete Fourier transform, and not to specify a required algorithmic implementation. For example, a fast Fourier transform could be used instead.

The discrete Fourier transform in Equation (8) collects N discrete samples of the signal over a finite observation interval, or "window", of length $t_{N-1} - t_0$ [time]. Therefore, the complex coefficients within $H(\omega_k)$ represent the entire temporal span of the data and are denoted by prior art as being time independent. However, they are inclusive of the entire set of discrete data located within the observation interval or window. Likewise, $h(t_n)$ are denoted as being frequency independent. In some approaches, transforming a signal over its entire observation interval $t_0 \ldots t_{N-1}$ into the frequency domain provides a static image of the time-ordered nature of information within the window. However, it does not yield transient information such as when energy information described by a pulse comes into existence, how long it persists, and when it finally dissipates and disappears.

At block 512, the temporal sequence of events in the time-frequency domain is established such that the signal can be sectioned into samples of identical (or similar) length using a series of overlapping windows. FIG. 9 illustrates an example of Method 500 distributing a digital signal $\hat{h}(t_n)$ into: $\ell = 0, 1, \ldots, L-1$ for a total of L [windows]; with each window including $m = 0, 1, \ldots, M-1$ for a total of $$M\left[\frac{\text{samples}}{\text{window}}\right];$$

and, where $\Delta m$ [samples] is the shift along the digital signal between adjacent overlapping windows. The current window $\ell$ spans an interval of time $\tau$ [time] and is used to observe, sample, and analyze the signal that has occurred immediately prior to the current time $t_n$. Moreover, as the signal continues to evolve into the future, beyond the current time $t_n$, it can then progressively be observed, sampled, and analyzed using additional windows at shifted intervals of $\Delta m$.

Figure 10:
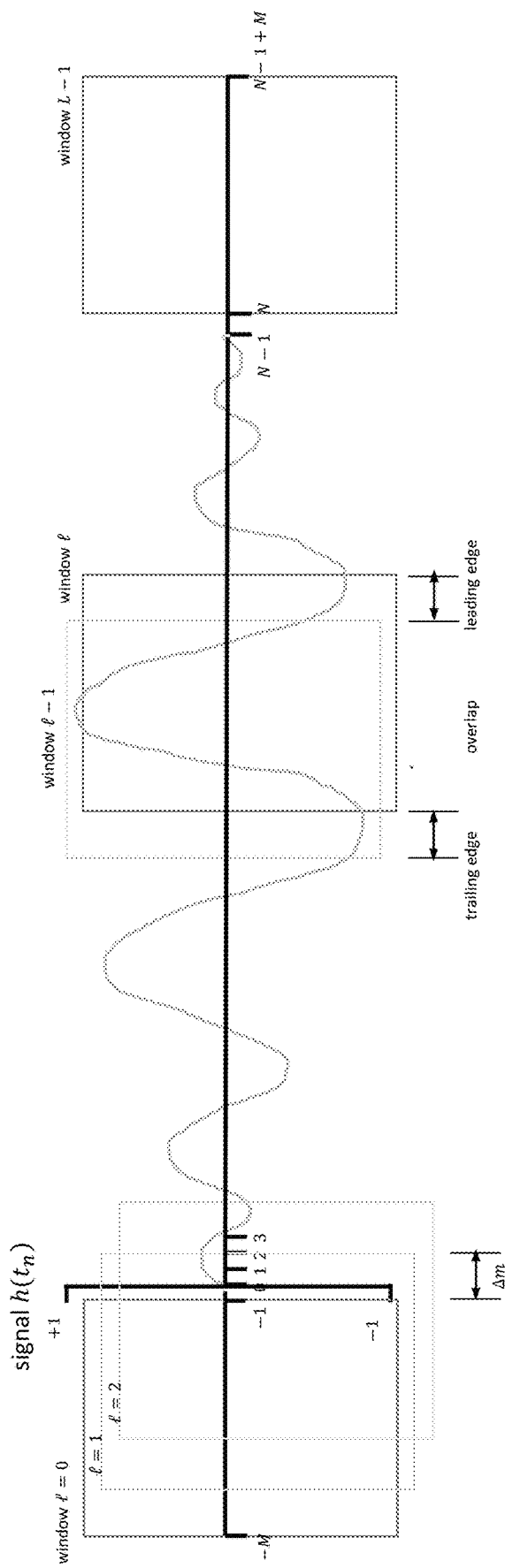
FIG. 10 illustrates an example of sampling, and distributing into windows, of a signal, in accordance with the method of FIG. 8.

In some cases, at block 514, one full window of zeros can be placed prior to the digitally sampled signal. In yet another case, a signal is continuously updated from a measurement device, such as a microphone, which is then sampled and analyzed in real time. In the example of FIG. 10, for a pre-recorded signal, this window of zeros is denoted as window index $\ell = 0$. FIG. 10 exhibits an example idealized signal s(t) digitally sampled into $h(t_n)$. At blocks 516 to 520, the signal is distributed into windows $\ell = 0, 1, \ldots, L-1$. At block 516, sections of the digital signal are mapped to the next window. At block 518, sections of the digital signal are mapped to subsequent windows. At block 520, the last window is zero padded. FIG. 10 presents the example signal of length N that is zero-padded by a window of length M on the front, producing a new signal of total length $\overline{N} = N - 1 + M$. Zero-padding can be used to help quantify the creation, persistence, and dissipation of energy pulses within the time-frequency domain. The complete evolution of energy pulses can be captured in the time-frequency domain with initial conditions of zero energy. Thus, zero-padding introduces a datum of zero information energy for a period $M \cdot T$ at the start of the input audio signal sample.

Method 500 can be used to input digital signal information, an example of which is depicted in FIG. 10, through zero padding and windowing. To do so, absolute time and relative time should be distinguished. The absolute signal time $t_n$ refers to the elapsed time from the origin of the digital signal, spanning the interval from the start $t_0$ to the end $t_{N-1}$ of the signal. Similarly, the zero-padded signal is shifted in time $\bar{t}_{\bar{n}}$ relative to $t_n$, and spans the interval from $\bar{t}_0$ to $\bar{t}_{\overline{N}-1}$. Distributing the shifted and zero padded signal into observation windows introduces a relative time $\bar{t}_{m,\ell}$ for each window and refers to the elapsed time from the origin of window $\ell$ and spans the interval $\bar{t}_{0,\ell}$ to $\bar{t}_{M-1,\ell}$. Signal sample $t_n$ is obtained at the current time, with prior samples occurring in the past, and samples ahead of $t_n$ occurring in the future.

At block 512, the zero-padded signal is mapped into the zeroth window $\ell = 0$ by mapping a section of the input discrete signal $\hat{h}(t_n)$ into $\overline{h}(\bar{t}_{m,0})$ for $m = 0, \ldots, M-1$ data points per window. The mapping process for window $\ell = 0$ is as follows:

$$\overline{h}(\bar{t}_{m,0}) = \overline{h}(\bar{t}_{\bar{n}}) \text{ for } m=0,1,\ldots, M-1 \text{ where } \bar{n}=m \quad \text{Equation (11)}$$

Given the zero-padding operation on the signal, the zeroth window is entirely comprised of zeros in Equation (11), this first window does not overlap in time with any data from the input signal because it ends before the first data point in $\hat{h}(t_0)$. The zero padding within the zeroth window provides substantial and practical advantages. Other approaches generally position window $\ell = 0$ just as the signal begins to be observed and then measures at $\hat{h}(t_0)$. In contrast, the digital spectrogram module 230 positions window $\ell = 0$ so that it covers the span of signal data $\hat{h}(t_n)$ before any time-ordered information (energy pulse) has been synthesized in the time-frequency space; and consequently, can be transmitted, observed, and/or measured in the signal.

At block 514, the signal is mapped into the next window $\ell = 1$. Let the next window $\ell = 1$ be shifted by $\Delta m$ sampling points along $\hat{h}(t_n)$ relative to $\ell = 0$. An example of this mapping is illustrated in the example of FIG. 10 Given that the sampling interval T is the same for $\overline{h}(\bar{t}_{m,\ell})$ as it is for $\hat{h}(t_n)$, this shift can be denoted as $\Delta m$ subject to $$1 \leq \Delta \ll mM\left[\frac{\text{samples}}{\text{window}}\right].$$

The mapping for window $\ell = 1$ is as follows:

$$\overline{h}(\bar{t}_{m,1}) = \overline{h}(\bar{t}_{\bar{n}}) \text{ for } m=0,1,\ldots, M-1 \text{ where } \bar{n}=m \quad \text{Equation (12)}$$

Note that $\overline{h}(\bar{t}_0 \leq \bar{t}_{\bar{n}} \leq \bar{t}_{M-1}) \equiv 0$ (zero padded) and the non-zero contribution of data to window $\ell = 1$ arises from $\overline{h}(\bar{t}_M \leq \bar{t}_{\bar{n}} \leq \bar{t}_{M+\Delta m})$.

At blocks 516 and 518, subsequent window $\ell$ is mapped by designating intermediate windows where $2 \leq \ell \leq L-1$, $h(\bar{t}_{m,\ell})$ as window $\ell$:

$$\overline{h}(\bar{t}_{m,\ell}) = \overline{h}(\bar{t}_{\bar{n}}) \text{ for } m=0,1,\ldots, M-1 \text{ where } \bar{n}=\Delta m \cdot \ell + m \quad \text{Equation (13)}$$

At block 520, the signal is mapped into the last window $\ell = L-1$. The mapping for window $L-1$ is as follows:

$$\bar{h}(\bar{t}_{m,L-1}) = \bar{h}(\bar{t}_{\bar{n}}) \text{ for } m = 0, 1, \ldots, M-1 \text{ where}$$
$$\bar{n} = \Delta m \cdot (L-1) + m \quad \text{Equation (14)}$$

Hence, the last window is zero padded because it starts after the last data point $\hat{h}(t_{N-1})$ such that: $\bar{h}(\bar{t}_{m,L-}) \equiv 0$. Zero padding the last window is particularly advantageous. Other approaches generally have the end of window $L-1$ just as the signal ends and is no longer observed and measured at $\bar{h}(t_N)$. In this embodiment, the last window is positioned so that it extends past the last point for which signal information $\bar{h}(t_N)$ was observed and measured. In so far as the signal information transmits energy from the pulse that was synthesized in the time-frequency space, that energy has now entirely dissipated.

Thus, the digital signal in absolute time $\hat{h}(t_n)$ can be mapped into the shifted time $\bar{h}(\bar{t}_{\bar{n}})$ and window time $\bar{h}(\bar{t}_{m,\ell})$ as:

---

Equation (15a)

mapping $\hat{h}(t_n) \to \bar{h}(\bar{t}_{\bar{n}})$:
$\bar{h}(\bar{t}_{\bar{n}}) = \hat{h}(t_n)$ for $n = 0, \ldots, N-1$ where $\bar{n} = n + M$ Equation (15b)

mapping $\bar{h}(\bar{t}_{\bar{n}}) \to \bar{h}(\bar{t}_{m,\ell})$:
for $\ell = 0, 1, \ldots, L-1$
  if $\ell = 0$
    $\bar{h}(\bar{t}_{m,\ell}) = 0$ for $m = 0, 1, \ldots, M-1$ (zero padding)
  else if $1 \leq \ell \leq L-2$
    $\bar{h}(\bar{t}_{m,\ell}) = \bar{h}(\bar{t}_{\bar{n}})$ for $m = 0, 1, \ldots, M-1$
    where $\bar{n}_* = \Delta m \cdot \ell + m$
  else if $\ell = L-1$
    $\bar{h}(\bar{t}_{m,\ell}) = 0$ for $m = 0, 1, \ldots, M-1$ (zero padding)
  end if
end for

---

Note that T has the same meaning and magnitude in each of the relative and absolute time mapping.

At block 522, the digital spectrogram module 230 outputs the windows containing the digital signal data.

The shift between adjacent overlapping windows $\Delta m$ [samples] along the digitally sampled signal can be further interpreted. In this case, a discrete shift along the temporal length of the signal is an attribute of its respective window, and the relative advancement of the window $$v \left[ \frac{\text{samples}}{\text{window}} \right],$$

can be denoted as:

$$v = \frac{\Delta m}{\Delta \ell} \quad \text{Equation (16)}$$

The relative advancement of the window v constrains the number of windows $\ell = 0, 1, \ldots, L-1$ [windows] used to observe and analyze the sampled signal as:

$$L = \frac{\bar{N} - M}{v} \quad \text{Equation (17)}$$

The maximum number of windows occurs when $\Delta m$, and hence v increments by a single sample, resulting in $L = \bar{N} - M$. The total number of windows decreases as $M \to \bar{N}$ and as $v \to \bar{N} - M$.

The window velocity $$V \left[ \frac{\text{time}}{\text{window}} \right]$$

associated with each adjacent window position is defined as a function of window advancement $$v \left[ \frac{\text{samples}}{\text{window}} \right]$$

and the sampling interval $$T \left[ \frac{\text{time}}{\text{sample}} \right]$$

as:

$$V = vT \quad \text{Equation (18)}$$

Defining window advancement v and window velocity V provides distinct utilitarian advantages. With reference to the example of FIG. 9, an incremental step of window index $\Delta \ell$ [window] is taken along the digital signal; for instance, the increment step between window $\ell - 1$ and $\ell$ is $\Delta \ell = \ell - (\ell - 1) = 1$. This incremental shift between adjacent windows can be transformed into an increment in time $\Delta t$ [time] as:

$$\Delta t = \Delta \ell \cdot v \cdot T \quad \text{Equation (19a)}$$

$$\Delta t = \Delta \ell \cdot V \quad \text{Equation (19b)}$$

$$\Delta t = \Delta m \cdot T \quad \text{Equation (19c)}$$

The window velocity V is a relativistic concept that represents the speed that the window travels in time relative to a previously observed and sampled section of a signal. Moreover, the window velocity controls the amount of new information in each adjacent window relative to its previous position, with the amount of new information given by $\Delta m$ [samples].

Figure 11:
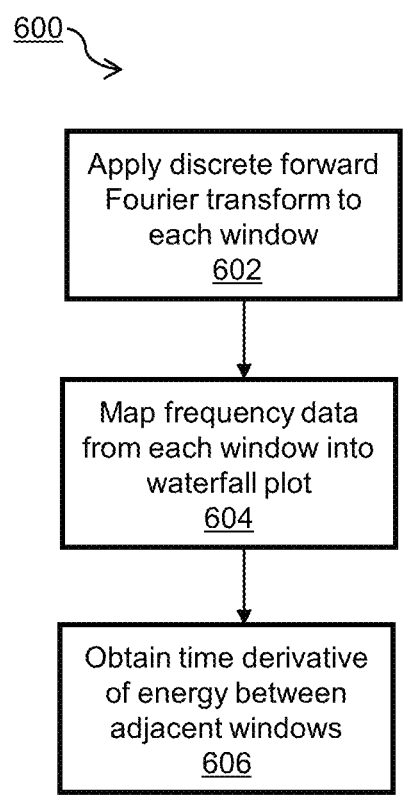
FIG. 11 is a flow chart of a method for constructing a digital spectrogram, in accordance with an embodiment.

As illustrated in FIG. 11, method 600, performed by the digital spectrogram module 230, uses the windowed digital signal to construct a digital spectrogram. Method 600 uses a numerical analysis technique and uses conservation of energy information between the windowed digital signal and the resulting digital spectrogram. This approach relies upon a discrete interpretation of the derivative $$\frac{d^2 \varepsilon}{dt d\omega} [\text{joules}/(\text{time} \cdot \text{frequency})]$$

from Equation (4). Notably, the units of $$\frac{d^2 \varepsilon}{dt d\omega}$$

could alternatively be stated in terms of [joules], but the former representation is more intuitive when considering the distribution of information within the time-frequency domain of the spectrogram.

At block 602, the digital spectrogram module 230, receives input from block 522 and determines the discrete Fourier transform of each window, for example, to determine the sound energy within a window for each frequency. For window $\ell = 0, \ldots, L-1$, the signal within each sequential window $\overline{h}(\overline{t}_{m,\ell})$ is transformed into the time-frequency domain as an expression of average energy over an increment of frequency $\Delta\omega$ and window period $\ell$ which spans MT time, $$\frac{1}{MT}\frac{\Delta E}{\Delta\omega}(\ell, \omega_k)$$

as:

$$\frac{1}{MT}\frac{\Delta E}{\Delta\omega}\left(\ell, \frac{k}{MT}\right) = \frac{1}{M}\sum_{m=0}^{M-1}\overline{h}(mT, \ell)e^{-2\pi i m k/M} \quad \text{Equation (20)}$$

for $k = 0, 1, \ldots, M-1$ where:

$$\omega_k = \frac{k}{MT},$$

$\overline{t}_{m,\ell} = (mT, \ell)$, k is tne frequency index for the complex coefficients of the average energy within window $\ell$ and frequency $\omega_k$ as $$\frac{1}{MT}\frac{\Delta E}{\Delta\omega}(\ell, \omega_k).$$

Note that the $$\frac{1}{MT}$$

in the expression of $$\frac{1}{MT}\frac{\Delta E}{\Delta\omega}(\ell, \omega_k)$$

is retained to express $$\frac{\Delta E}{\Delta\omega}(\ell, \omega_k)$$

per unit "volume" of the sampling interval here measured in $$M\left[\frac{\text{samples}}{\text{window}}\right]$$

spanning an interval of MT [time], where the $$\frac{1}{T}$$

originates from Equation (2) and the $$\frac{1}{M}$$

originates from Equation (20). Multiplication of $$\frac{1}{MT}\frac{\Delta E}{\Delta\omega}(\ell, \omega_k)$$

by volume of the sampling interval MT [time] yields an average estimate of the derivative of energy with respect to frequency $$\frac{\Delta E}{\Delta\omega}(\ell, \omega_k)$$

that was observed and measured across window $\ell$.

Figure 12:
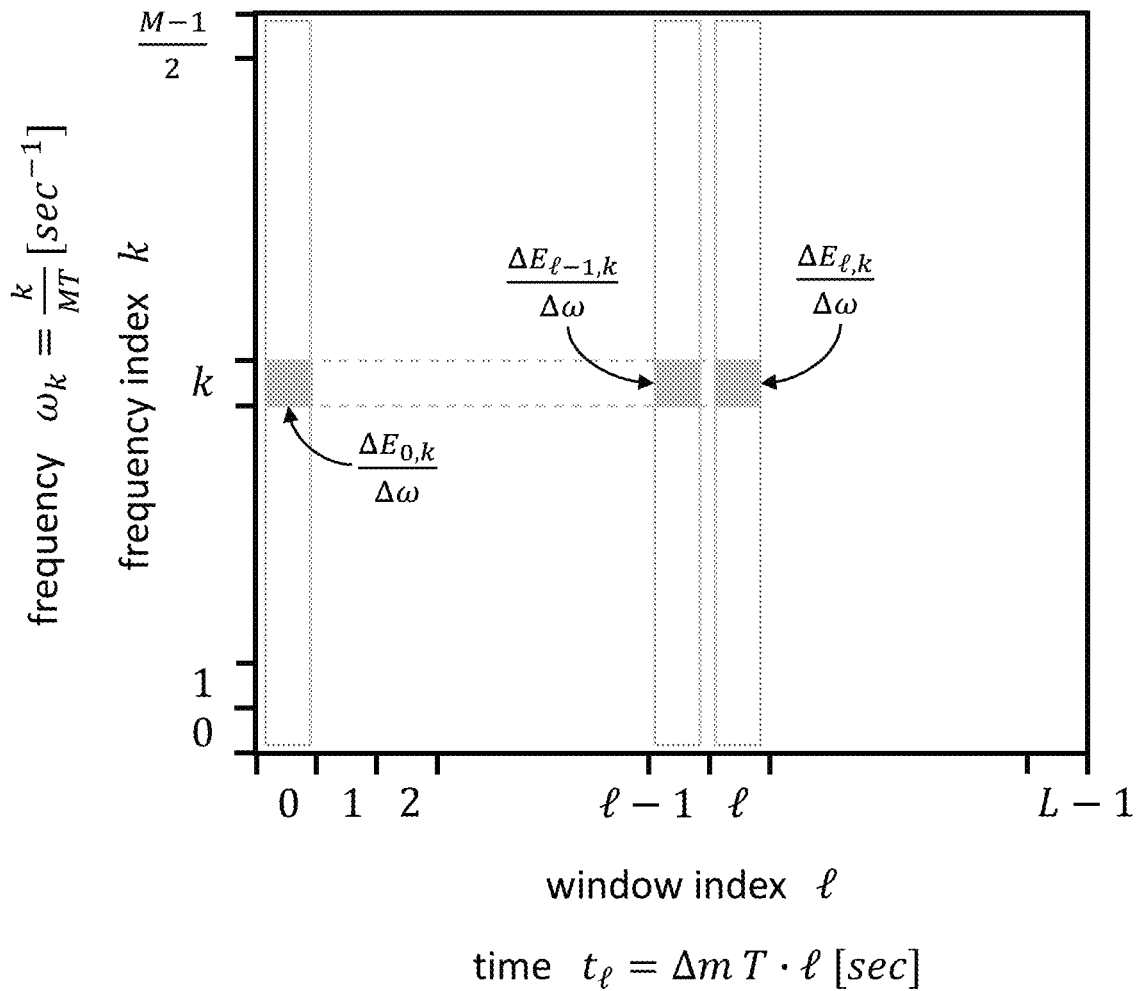
FIG. 12 illustrates an example arrangement of a Fourier transform of a signal from each window in a waterfall plot, in accordance with the method of FIG. 11.

At each window, at block 604, the digital spectrogram module 230 creates a sequence of $$\frac{\Delta E}{\Delta\omega}$$

values at frequency $\omega_k$ and window position $\ell$. The resulting window-frequency image can be presented as a waterfall plot as shown on FIG. 12. Note that in FIG. 12, there is a condensed notation of $$\frac{\Delta E}{\Delta\omega}(\ell, \omega_k) \text{ to } \frac{\Delta E_{\ell,k}}{\Delta\omega}$$

for window index $\ell$ at frequency index k in the time-frequency domain. Given the symmetry in the Fourier transform operation of the discrete data $\overline{h}(\overline{t}_{m,\ell})$ about the Nyquist frequency, values of $$\frac{\Delta E_{\ell,k}}{\Delta\omega}$$

are only shown in the range k=0,1, . . . , $$\frac{M-1}{2}.$$

Generally, such approaches do not provide guidance on the degree of overlap $\Delta m$ between adjacent windows, as shown on FIG. 9. Moreover, historically, any amount of overlap between windows yields a waterfall plot that, when reversed back into the time domain, produces sharp phase discontinuities in the recreated signal. This is because information within each window is determined independently of any adjacent windows. The present embodiments address this substantial technical problem.

The temporal length of each window is $\tau=MT$, where the number of measurements in a window M and sampling interval T are chosen to provide the desired resolution along the frequency axis $\omega_{min} \leq \omega \leq \omega_{max}$, where $$\omega_{max} = \frac{1}{2T}[\text{time}^{-1}]$$

and $\omega_{min}=0$ [time$^{-1}$]. The increment length of each bin along the frequency axis can be inferred to be $$\Delta\omega = \frac{\omega_{max} - \omega_{min}}{N_b}.$$

The number of bins $N_b$ along the frequency axis is equal to half the number of measurements in the window as $$N_b = \frac{1}{2}M\left[\frac{\text{samples}}{\text{window}}\right].$$

Therefore, the following identity results:

$$\Delta\omega = \frac{\omega_{max} - \omega_{min}}{N_b} \Rightarrow \Delta\omega = \qquad \text{Equation (21)}$$
$$\left(\frac{1}{2T}\right)/\left(\frac{1}{2}M\right) \Rightarrow \Delta\omega = \frac{1}{TM}[\text{time}^{-1}] \Rightarrow \Delta\omega \cdot \tau = 1$$

The above identity states that improvements in frequency resolution of the time-frequency domain require either: a commensurate decrease in the sampling interval $\Delta t$ as given by Equation (1), and hence sampling interval T for a fixed M; or, by increasing the number of measurements within each window M for a given sampling interval T. As an example, for the standard sound file with 1 second long windows, each window has the following properties:

$$T = \frac{1}{44,100}\left[\frac{\text{seconds}}{\text{sample}}\right], \tau = 1[\text{second}],$$

and hence $$M = 44,100\left[\frac{\text{samples}}{\text{window}}\right],$$

and yields a maximum frequency of $\omega_{max}=22,050$ Hz as reduced by the Nyquist frequency.

The discrete Fourier transform, as expressed by Equation (20), is used to extract the average energy at measurable frequencies $\omega_k$ from the finite length signal within window $\ell$ spanning the time interval $\tau$. Additionally, the discrete Fourier transform is also used to sample the preceding window $\ell-1$ of data. The utility of the discrete Fourier transform is that it can disaggregate the a priori unknown frequency distribution of the energy information that occurs within each window of $\overline{h}(\bar{t}_{m,\ell})$ into $$\frac{\Delta E_{\ell,k}}{\Delta\omega}.$$

Figure 13:
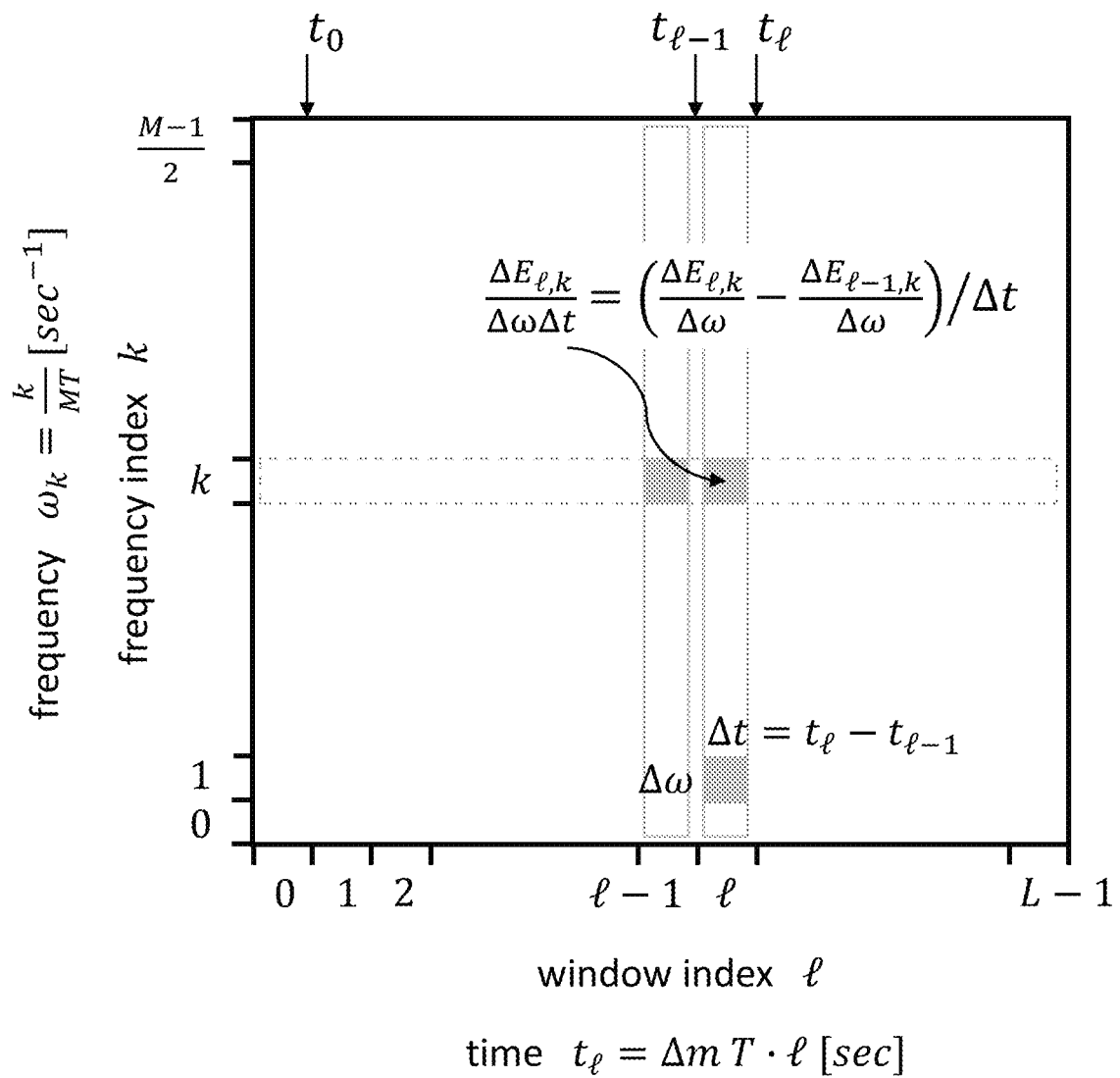
FIG. 13 illustrates an example visualization of a finite difference determination of a waterfall plot for generating a digital spectrogram, in accordance with the method of FIG. 11.

However, further differentiation with respect to time is required to construct $$\frac{\Delta E_{\ell,k}}{\Delta\omega\Delta t}$$

as an approximation of $$\frac{d^2\varepsilon}{d\omega dt}.$$

denoted by Equation 19c. FIG. 13 depicts the manner in which the time derivative of $$\frac{\Delta E}{\Delta\omega\Delta t}$$

is constructed. The derivative $$\frac{\Delta E_{\ell,k}}{\Delta\omega\Delta t}$$

at window $\ell$ and frequency k gains new information energy $$\frac{\Delta E_{\ell,k}}{\Delta\omega}$$

that appears at frequency index k within the leading edge of window $\ell$ spanned by $\overline{h}(\bar{t}_{M-1-\Delta m,\ell} \leq \bar{t}_{m,\ell} \leq \bar{t}_{M-1,\ell})$. Similarly, $$\frac{\Delta E_{\ell,k}}{\Delta\omega\Delta t}$$

accounts for the loss of information energy within the trailing edge of window $\ell-1$ spanned by $\overline{h}(\bar{t}_{0,\ell-1}\leq\bar{t}_{m,\ell-1}\leq\bar{t}_{\Delta m-1,\ell-1})$. Energy within the time interval spanned by $\overline{h}(\bar{t}_{0,\ell}\leq\bar{t}_{m,\ell}\leq\bar{t}_{M-1-\Delta m,\ell})$ within window $\ell$, or alternatively $\overline{h}(\bar{t}_{\Delta m,\ell-1}\leq\bar{t}_{m,\ell-1}\leq\bar{t}_{M-1,\ell-1})$ within window $\ell-1$, is common to both $$\frac{\Delta E_{\ell,k}}{\Delta\omega} \text{ and } \frac{\Delta E_{\ell-1,k}}{\Delta\omega}$$

and hence cancels when generating $$\frac{\Delta E_{\ell,k}}{\Delta\omega\Delta t}.$$

This is expressed as:

$$\frac{\Delta E_{\ell,k}}{\Delta\omega\Delta t} = \left(\frac{\Delta E_{\ell,k}}{\Delta\omega} - \frac{\Delta E_{\ell-1,k}}{\Delta\omega}\right)/\Delta mT \qquad \text{Equation (22)}$$

FIG. 13 presents an example visualization of Equation (22). The front zero padding ensures an initial condition of zero such that the Fourier transform of window index $\ell=0$ is zero:

$$\frac{\Delta E_{0,k}}{\Delta \omega} = 0.$$

Therefore, the first derivative position is implicitly defined as equal to the discrete Fourier transform of the first window, as:

$$\frac{\Delta E_{\ell,k}}{\Delta \omega \Delta t} \equiv \frac{1}{\Delta mT} \frac{\Delta E_{1,k}}{\Delta \omega} - 0.$$

In some cases, $$\frac{\Delta E_{\ell,k}}{\Delta \omega \Delta t}$$

from Equation (22) can be approximated by zero-padding all energy within the overlap time interval spanned by $\overline{h}(\bar{t}_{0,\ell} \leq \bar{t}_{m,\ell} \leq \bar{t}_{M-1-\Delta m,\ell})$ within window $\ell$ and only retaining that information at the leading edge of window $\ell$ in the interval spanned by $\overline{h}(\bar{t}_{M-1-\Delta m,\ell} \leq \bar{t}_{m,\ell} \leq \bar{t}_{M-1,\ell})$. Therefore, only the most recent $\Delta m$ values of signal data within window $\ell$ are used to construct $$\frac{\Delta \hat{E}_{\ell,k}}{\Delta \omega \Delta t}.$$

This process can be visualized on FIG. 10 where energy within the overlapping segment of window $\ell$ with window $\ell - 1$ is assumed to perfectly cancel during the difference operation of Equation (22), and energy within the trailing edge with window $\ell - 1$ is ignored. Because both windows are of length M samples, the discrete Fourier transform results in the same resolution of the frequency band $\omega_k$ of information as Equation (22). Advantageously, because this approximation $$\frac{\Delta \hat{E}_{\ell,k}}{\Delta \omega \Delta t}$$

only focuses on the most recent $\Delta m$ values of signal data, it provides a more succinct estimation of the creation, occurrence, or dissipation of information within the time-frequency domain and is the preferred operation for estimating $$\frac{\Delta E_{\ell,k}}{\Delta \omega \Delta t}.$$

Equation (23) denotes this approximation as:

$$\frac{\Delta E_{\ell,k}}{\Delta \omega \Delta t} \approx \frac{\Delta \hat{E}_{\ell,k}}{\Delta \omega \Delta t} \qquad \text{Equation (23)}$$

Note that $$\frac{\Delta \hat{E}_{\ell,k}}{\Delta \omega \Delta t}$$

is complex-valued, which is a manifestation of the phase offset resulting from the shifted origin of each window $\bar{t}_{0,\ell}$ in time relative to the origin of the input signal $t_0$ in absolute time.

The finite difference determination from Equation (22) in the time-frequency domain relies on the change of energy within frequency specific bins as the sampling window $\ell$ advances. Equation (24) implies a scalar relationship when constructing the time derivative based on the shift between adjacent windows as $\Delta t = \Delta \ell \cdot V = \Delta m \cdot T$:

$$\frac{\Delta \hat{E}_{\ell,k}}{\Delta \omega \Delta t} = \frac{\Delta \hat{E}_{\ell,k}}{\Delta \omega \Delta m \cdot T} = \frac{\Delta \hat{E}_{\ell,k}}{\Delta \omega \Delta \ell \cdot V} \qquad \text{Equation (24)}$$

This relationship follows from Equations 19a, 19b and 19c and indicates that $$\frac{\Delta \hat{E}_{\ell,k}}{\Delta \omega \Delta t}$$

is equally with respect to the amount of new information $\Delta m$ as it is with respect to time $\Delta t$. The maximum theoretical fidelity of the finite difference $\Delta t$ occurs at the minimum window velocity when $v=1$, which requires that the window velocity be equal to the sampling interval $V=T$. This is because the finite difference between each window increments by the smallest possible amount, providing as much information as possible for a given sampling rate T. However, practical application requires larger than the minimum window velocity for representative approximations of $$\frac{\Delta \hat{E}_{\ell,k}}{\Delta \omega \Delta t}.$$

As the position velocity becomes large and approaches the window size $$V \rightarrow M,$$

the amount of new information in each window is increased and the finite difference may have difficulty capturing subtle changes in the information energy. Generally, there is an increase in computational cost associated with an increase in the temporal-fidelity of the spectral analysis.

The result of estimating the discrete derivative for each sequential window of information describing the change in vibrational energy with respect to time $$\frac{\Delta E_{\ell,k}}{\Delta \omega \Delta t}$$

is herein referred to as a digital spectrogram.

The concepts of absolute time and relative time can be advantageously used to resolve digital spectrogram inversion problems, specifically relating to phase continuity issues. The difference between absolute and relative time can manifest itself as a phase offset and can be expressed through the complex valued coefficients of $$\frac{\Delta \hat{E}_{\ell,k}}{\Delta \omega \Delta t},$$

where values of $$\frac{\Delta \hat{E}_{\ell,k}}{\Delta \omega \Delta t}$$

are derived from the discrete Fourier transform of each sampling window $\ell$. Continuity in phase offset within the signal can be preserved by the consistent shifting of consecutive windows by $\Delta m$ with zero padding on the front of the signal, as shown in the example of FIG. 10. Thereafter, continuity in phase offset is preserved in the time-frequency domain of the discrete spectrogram $$\frac{\Delta \hat{E}_{\ell,k}}{\Delta \omega \Delta t}$$

via both the real and imaginary components of these complex coefficients.

Figure 14:
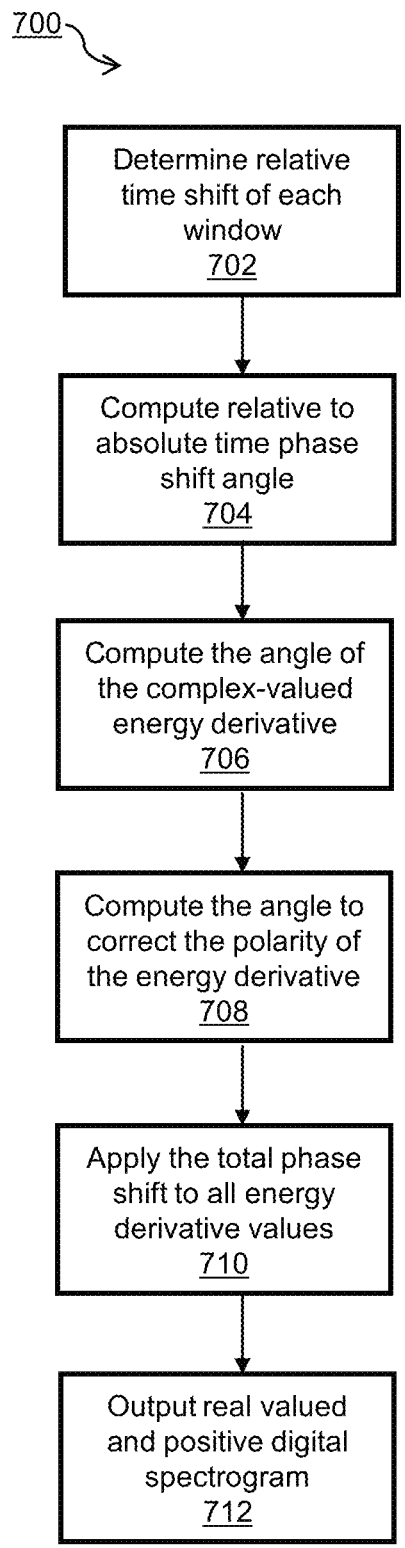
FIG. 14 is a flow chart of a method for quantifying phase shifting for phase continuity, in accordance with an embodiment.

As illustrated in FIG. 14, Method 700, performed by the digital spectrogram module 230, quantifies the process of phase shifting $$\frac{\Delta \hat{E}_{\ell,k}}{\Delta \omega \Delta t},$$

as outputted in method 600, to ensure phase continuity. Phase shifting represents a convolution integration and is implemented by multiplying the percentage shift $$\frac{\lambda_{\ell,k}}{2\pi}$$

required to assure a consistent origin point for all energy by $$\frac{\Delta \hat{E}_{\ell,k}}{\Delta \omega \Delta t}$$

from method 600 in the digital spectrogram.

Ensuring phase shift continuity in the digital spectrogram $$\frac{\Delta \hat{E}_{\ell,k}}{\Delta \omega \Delta t}$$

can be interpreted with the concept of relative versus absolute time. Frequency information within window $\ell$ of the digital signal $\bar{h}(mT, \ell)$ is transformed into the digital spectrogram $$\frac{\Delta \hat{E}_{\ell,k}}{\Delta \omega \Delta t}$$

using the discrete forward Fourier transform given by Equation (20). If one were to apply the discrete forward Fourier transform to the entire signal $\hat{h}(nT)$, the starting position of the digital signal is given a phase shift of zero radians for all frequencies $\omega_k$. Instead, the starting position of the signal $\hat{h}(nT)$ is identified as the absolute time origin, $t_0=0$ [sec]. However, the process of windowing the entire signal causes the origin of each window to be shifted relative to the absolute time origin. During application of the discrete forward Fourier transform within each window, the starting position $\bar{h}(0, \ell)$ is given a phase shift of zero radians, for all frequencies $\omega_k$ and windows $\ell$. Consequently, the energy information of each window requires a phase shift to be consistent with the absolute time origin. At block 702, the window information from block 522 is received and then the spectrogram module 230 determines the relative time shift $t_\ell$ [time] of window $\ell$ as:

$$t_\ell = -MT + \ell \Delta mT - t_0 \quad \text{Equation (25)}$$

where, $t_0$ is the origin in absolute time. At block 704, for frequency $$\omega_k = \frac{k}{MT},$$

the digital spectrogram module 230 obtains the relative to absolute time phase shift $\psi_{\ell,k}$ [radians] for each frequency in each window as:

$$\psi_{\ell,k} = 2\pi \cdot (1 - \text{modulus}(t_\ell \cdot \omega_k)) \quad \text{Equation (26)}$$

At block 706, the digital spectrogram module 230 obtains the second phase adjustment by computing the angle $\theta_{\ell,k}$ [radians] of the magnitude of $$\frac{\Delta \hat{E}_{\ell,k}}{\Delta \omega \Delta t}$$

as:

$$\theta_{\ell,k} = \tan^{-1} \frac{\mathcal{I}\left(\frac{\Delta \hat{E}_{\ell,k}}{\Delta \omega \Delta t}\right)}{\left|\mathcal{R}\left(\frac{\Delta \hat{E}_{\ell,k}}{\Delta \omega \Delta t}\right)\right|} \quad \text{Equation (27)}$$

where $$\mathcal{I}\left(\frac{\Delta \hat{E}_{\ell,k}}{\Delta \omega \Delta t}\right) \text{ and } \mathcal{R}\left(\frac{\Delta \hat{E}_{\ell,k}}{\Delta \omega \Delta t}\right)$$

denote the imaginary and real components of the complex valued $$\frac{\Delta \hat{E}_{\ell,k}}{\Delta \omega \Delta t}.$$

At block 708, the digital signal module obtains the third phase adjustment using the odd property of the sine function to correct the polarity, such that the real-value spectrogram data $$\mathcal{R}\left(\frac{\Delta \hat{E}_{\ell,k}}{\Delta \omega \Delta t}\right)$$

are positive only $\varsigma_{\ell,k}$ [radians], as:

if $\mathcal{R}\left(\frac{\Delta \hat{E}_{\ell,k}}{\Delta \omega \Delta t}\right) < 0$ then  Equation (28)

$\varsigma_{\ell,k} = \pi$ $\mathcal{R}\left(\frac{\Delta \hat{E}_{\ell,k}}{\Delta \omega \Delta t}\right) = \left|\mathcal{R}\left(\frac{\Delta \hat{E}_{\ell,k}}{\Delta \omega \Delta t}\right)\right|$ else $\varsigma_{\ell,k} = 0$ end if At block 710, the digital spectrogram module 230 obtains the total phase adjustment $\lambda_{\ell,k}$ [radians] as:

$$\lambda_{\ell,k} = \psi_{\ell,k} + \theta_{\ell,k} + \varsigma_{\ell,k} \qquad \text{Equation (29)}$$

The digital spectrogram module 230 then receives the time derivative of the digital spectrogram $$\frac{\Delta E_{\ell,k}}{\Delta \omega \Delta t}$$

from block 606. Each discrete derivative value within the digital spectrogram is then phase shifted as:

$$F_{\ell,k} = \mathcal{R}\left(\frac{\Delta \hat{E}_{\ell,k}}{\Delta \omega \Delta t}\right) \cdot \text{modulus}\left(\frac{\lambda_{\ell,k}}{2\pi}\right) \qquad \text{Equation (30)}$$

where, $\mathcal{F}_{\ell,k}$ is the real-valued energy expression resulting from phase shifting the spectral analysis of each window $\ell$ for each frequency k to be in phase with the absolute starting position of the signal. $\mathcal{F}_{\ell,k}$ is our interpretation of a digital spectrogram that may be inverted back into a signal. The convolution operation in Equation (30) results in time-shifting of energy information within the spectrogram such that it is consistent with the original signal. Transformation of the digital complex-valued spectrogram into a real-valued spectrogram ensures uniqueness of the information represented by the energy pulse patterns in time and frequency.

At block 712, the digital spectrogram module 230 outputs the real valued and positive digital spectrogram $\mathcal{F}_{\ell,k}$.

In some cases, $$\frac{\Delta \hat{E}_{\ell,k}}{\Delta \omega \Delta t}$$

from Equation (22) can be evaluated in slightly different progression of the same operations described above. Specifically, the origin phase shifting from Equation (26) could be applied directly to individual windows after the Fourier transform but prior to evaluating the derivative in Equation (22). This would ensure that the windows used to estimate the time derivative in block 606 would have a consistent origin point. Thereafter, proceed with blocks 706 to 712 of Method 700 by performing the phase shifts from Equations (27) and (28) to produce a digital spectrogram. This results in an alternative evaluation of $\mathcal{F}_{\ell,k}$.

Figure 15:
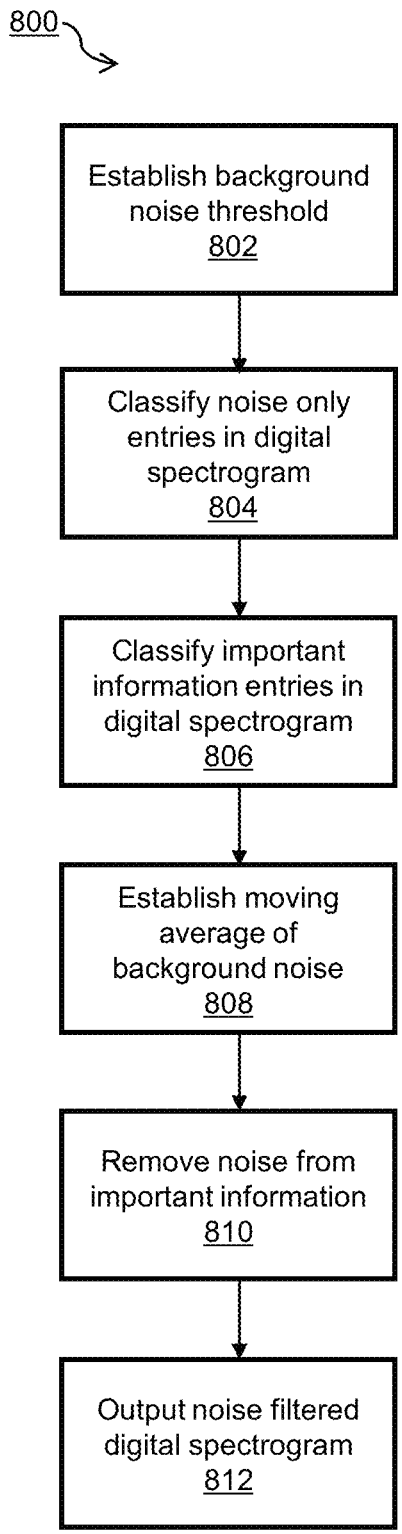
FIG. 15 is a flow chart of a method for removing background noise from an input digital spectrogram, in accordance with an embodiment.

As illustrated in FIG. 15, method 800, performed by the digital spectrogram module 230, removes background noise from an input digital spectrogram. Aggregating the energy information within overlapping windows allows for identifying, quantifying, and mitigating background/ambient noise from the digital signal prior to evaluating a function describing the noiseless analytical signal. Background noise is additive to the desired information expressed by $\mathcal{F}_{\ell,k}$ in Equation (30). Background noise provides an energy input that is a function of frequency $\omega_k$ and may establish a noise threshold value $\Psi_k$ to differentiate ambient noise from potentially important or relevant information, such as human speech. In some instances, the threshold value $\Psi_k$ could be static, variable, or even dynamically assisted by an artificial agent to optimally identify the threshold for background noise. At block 802, the digital spectrogram module 230 receives input from block 712 and then establishes a background noise threshold value $\Psi_k$ for the purpose of classifying values of the digital spectrogram $\mathcal{F}_{\ell,k}$ that contain important information to be analyzed. At block 804, all values of $\mathcal{F}_{\ell,k}$ with energy below the threshold value $\Psi_k$ are classified as containing noise only and consequently are "filtered' by being zeroed out when mapped to $\dot{\mathcal{F}}_{\ell,k}$. At block 806, all values of $\mathcal{F}_{\ell,k}$ with energy above the threshold are classified as containing both noise and important information and are mapped without modification to $\dot{\mathcal{F}}_{\ell,k}$. The outcome of the application of the noise threshold value $\Psi_k$ is to isolate those regions of the digital spectrogram that contain important information from those regions that do not, and consequently remove all energy that is considered unimportant.

The next step of in the process of removing background noise is to focus on those regions of the filtered digital spectrogram $\dot{\mathcal{F}}_{\ell,k}$ that contain an additive energy contribution from both noise and important information. At block 808, the digital spectrogram module 230 utilizes a moving average $\gamma_k$ over those elements of the digital spectrogram $\mathcal{F}_{\ell,k}$ that were previously classified as containing noise only, where these elements are adjacent to sections of the filtered digital spectrogram $\dot{\mathcal{F}}_{\ell,k}$ that are now targeted for noise removal. The moving average $\gamma_k$ is used to establish the noise contribution to the overall energy expressed by the important information within $\dot{\mathcal{F}}_{\ell,k}$. At block 810, the digital spectrogram module 230 may remove noise from the relevant information by subtracting $\gamma_k$ from the spectrogram $\dot{\mathcal{F}}_{\ell,k}$ as:

$$\hat{\mathcal{F}}_{\ell,k} = \max(\dot{\mathcal{F}}_{\ell,k} - \gamma_k, 0) \qquad \text{Equation (31)}$$

and resulting in the noise filtered digital spectrogram $\hat{\mathcal{F}}_{\ell,k}$. In some instances, the moving average background noise energy $\gamma_k$ may be larger than the collective energy within a frequency bin, where $\gamma_k > \dot{\mathcal{F}}_{\ell,k}$, which indicates an overestimation of the background noise energy. The resulting negative value for this case in Equation (31) is given a zero value to ensure the spectrogram remains positive and real-valued. Notably, the moving average $\gamma_k$ is a broad estimate of the background noise energy that may be more accurate for situations with consistent or relatively time-invariant sources of background noise. Other approaches may better resolve relevant information when less predictable sources of background noise are present. In another instance, a second microphone independently captures ambient noise, which provides a real-time estimate of $\gamma_k$ for each frequency k. For instance, the second microphone may be located at a point distant from the individual speaking albeit in the same automobile cabin. Hence, the voice information is barely discernible from the background noise and the information captured by the second microphone is a suitable real-time representation of the ambient noise.

At block 812, the digital spectrogram module 230 outputs the noise filtered digital spectrogram.

Figure 16:
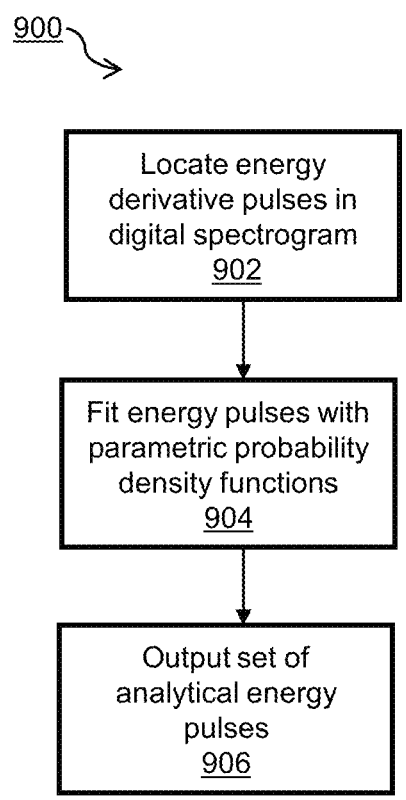
FIG. 16 is a flow chart of a method for converting a digital spectrogram into an analytical spectrogram, in accordance with an embodiment.

As illustrated in FIG. 16, method 900, performed by the digital spectrogram module 230, converts a digital spectrogram into an analytical spectrogram. At block 902, the digital spectrogram module 230 receives input from either block 712 or block 812 and converts the real-valued and phase-shifted, and in some cases noise-filtered, digital spectrogram $\hat{\mathcal{F}}_{\ell,k}$ into the analytical spectrogram $$\frac{d^2\varepsilon}{d\omega dt}$$

by employing a peak finding approach within the two-dimensional time-frequency domain of the indices $\ell$ and k to identify local maxima. In one instance, parametric probability density function pulse objects $\mathcal{S}_j(t, \omega)$ where j=0 ... $\mathcal{J}$ could be positioned with predefined characteristics at coordinates of each local maxima. This trial spectrogram representation would be an initial analytical guess to reproduce (approximate) its digital counterpart. In some instances, at block 904, the digital spectrogram module 230 could employ parameter optimization to create a set of best-fit two-dimensional parametric probability density function energy pulse objects $\mathcal{S}_j(t, \omega)$ over the entire time and frequency domain. The derivative $$\frac{d^2\varepsilon_{\mathcal{J}}}{d\omega dt}$$

can be expressed as:

$$\frac{d^2\varepsilon_{\mathcal{J}}}{d\omega dt} \equiv \sum_{j=0}^{\mathcal{J}} \mathcal{S}_j(t, \omega) \qquad \text{Equation (32)}$$

and represents a superposition of all energy pulses.

At block 906, the digital spectrogram module 230 outputs the set of parametric functions representing the analytical energy pulses that replicate the real-valued and positive digital spectrogram. Output is then directed to block 404 of the analytical spectrogram module for further processing into an analytical signal. The analytical signal is then sent to be received by the analytical signal module 250.

The process of digitally sampling a signal (as described in Method 300) provides an average representation of energy intercepted during transmission, as illustrated in Equation (2). For illustration, an analog signal can be thought of as an infinitely dense digitally sampled signal where $$\frac{1}{T} \rightarrow \infty \left[\frac{\text{samples}}{\text{time}}\right].$$

Therefore, the analog signal is consistent with the present interpretation of an analytically derived signal. The relationship between the absolute time increment $\Delta t$, the sampling interval T, and the window length M, as implied from Equation (21), can be determined as $\Delta t = \Delta m \cdot T$. Given a theoretical infinite density of samples, the sampling interval approaches zero $$T \rightarrow 0 \left[\frac{\text{time}}{\text{sample}}\right]$$

resulting in an infinitesimal time resolution as $$\Delta t \rightarrow dt.$$

The sampling density $$\frac{1}{T}$$

also controls the frequency resolution for spectral analysis: high sampling density provides high-frequency resolution. The identity from Equation (21), $$\Delta\omega = \frac{\frac{1}{T}}{M},$$

implies that the frequency resolution becomes infinitesimal as $$M \rightarrow \infty \left[\frac{\text{samples}}{\text{window}}\right] \text{ and } \frac{1}{T} \rightarrow \infty \left[\frac{\text{samples}}{\text{time}}\right]$$

with M approaching large numbers much faster than $$\frac{1}{T},$$

resulting in $$\Delta\omega \rightarrow d\omega.$$

It follows that each measure of energy information approaches infinitesimally small values with the time and frequency resolution:

$$\Delta\varepsilon \rightarrow d\varepsilon, \Delta\omega \rightarrow d\omega, \text{ and } \Delta t \rightarrow dt.$$

Therefore, $$\frac{\Delta \hat{E}_{\ell,k}}{\Delta \omega \Delta t} \to \frac{d^2 \varepsilon}{dt d\omega}.$$

Analytical spectrogram to signal generation (as described in method 400) can have widespread application to binary digit or "bit" packaging for data transmission through wired and wireless connections. Radio signals are used to wirelessly transmit data between a source and a receiver, often requiring encoding and decoding to ensure secure and efficient transmission. In some instances, such as FM radio, analog receivers are still used to transform radio waves into its intended physical expression of sound by controlling a speaker system. However, many contemporary wireless telecommunications applications use software, such as Bluetooth™ and Zigbee™ peer-to-peer connections, that digitally decode a received signal to complete the data transfer.

Advantageously, the present embodiments can be used to increase the information density of signal transmission relative to other approaches of imparting square waves directly into the signal, where these square waves represent a serial sequence of bits that are used to encode and transmit information. The theoretical channel capacity for these types of approaches in a noiseless medium is expressed by the Shannon-Hartley theorem in a noiseless channel as $C_B=2B \log_2 L$, where: $C_B$ is channel capacity in [bits/sec], B is the bandwidth of the channel [Hz], and L relates to the signal level as $L=2^n$ with n being the number of discrete states of the signal amplitude. Consider an example where the channel bandwidth of the antenna is B=3.2 [kHz], $L=2^1$ signal levels for binary information (i.e., on/off) are transmitted. The period of the square waveform used to denote information bits is $$T = \frac{1}{2B}.$$

The serial square-wave signal is transmitted as an electric current to an antenna and then converted to a radio signal to be received by a remote device. The received signal exhibits a theoretical maximum bitrate of $C_B=2B=6,400$ [bits/sec]. Thus, such approaches generally only allow a signal to transmit 2 bits of data per second across each 1 Hz frequency band for each signal level.

Figure 17:
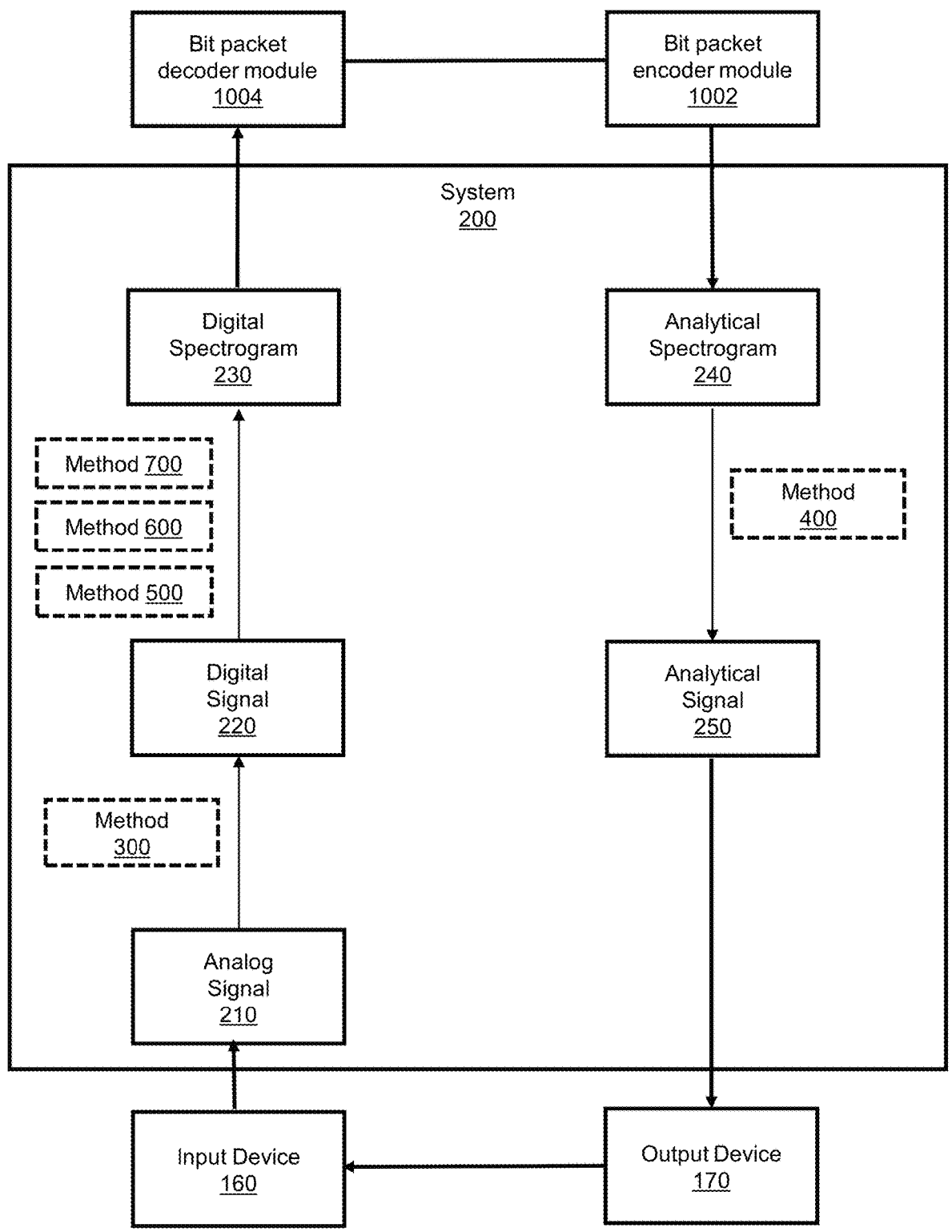
FIG. 17 is a schematic diagram representing an example of the system of FIG. 2 for binary bit packaging.

FIG. 17 illustrates an example flow diagram for an application of the present embodiments for synthesizing information for transmission through a signal. A bit packer encoding module 1002 receives the external information to be transmitted via input module 120. This information comprises the set of probability density functions representing the set of on/off bits to be transmitted. The bit packer encoding module 1002 then directs the information into the analytical spectrogram module 240 to subsequently synthesize the information for transmission as an analytical signal. This approach begins by querying a binary bit packaging codec, and then synthesizing bits of information within an analytical spectrogram that conform to the codec and represent information. Each bit is denoted by a two-dimensional Gaussian function representing an energy pulse within the time-frequency-space of the analytical spectrogram, with the pulse being given parameters representing the median position ($m_t$, $m_\omega$), scale ($\sigma_t$, $\sigma_\omega$) and amplitude (on equals "1" and off equals "0") as specified by the codec.

The codec then specifies how to group the set of bits into a data packet within an interval of time $\Delta t$ and frequency bandwidth $\Delta \omega = \omega_{max} - \omega_{min}$ of the analytical spectrogram. Then, Method 400, as described herein, is used to invert the analytical spectrogram into the synthesized signal s(t) through definite integration from [$\omega_{min}$, $\omega_{max}$] in the manner of Equation (6), resulting in the "packet signal". The signal is sent to output device 170 for transmission as a signal via wired or wireless communication. A bit packer decoding module 1004 can be used to receive an analog signal, such as an analog signal transmitted by the output device 170. Method 300, as described herein, can be employed to sample the resulting packet signal to create a digital signal representation of the enclosed bit information. Then, Method 500, Method 600, and Method 700 can be employed to construct a digital spectrogram. The bit packer decoding module 1004 can be used to decode the digital spectrogram and extracts the information located within the same interval of time $\Delta t$ and frequency bandwidth $\Delta \omega = \omega_{max} - \omega_{min}$ of the digital spectrogram.

In an example, four randomly generated 32-bit packets of information are transmitted as a signal, over a channel bandwidth $\Delta \omega = 3,200$ [Hz], from $\omega_{min}=2,000$ [Hz] to $\omega_{max}=5,200$ [Hz], with $L=2^1$ signal levels.

Unit Packet: [1 1 1 1 1 1 1 1 1 1 1 1 1 1 1 1 1 1 1 1 1 1 1 1 1 1 1 1 1 1 1 1]

Packet 1: [0 0 0 0 1 1 0 1 0 1 0 1 0 1 1 0 1 1 0 0 0 0 1 1 0 0 0 0 1 0 1 1]

Packet 2: [0 1 0 1 0 0 0 0 0 1 0 0 0 0 1 0 1 0 1 0 1 0 1 0 1 1 0 0 1 0 1 0]

Packet 3: [0 0 1 0 0 1 1 0 1 1 1 0 1 1 0 0 0 1 1 1 1 0 1 1 1 1 0 1 0 1 0]

Packet 4: [1 1 1 0 0 0 0 0 0 0 1 0 0 0 1 1 1 0 0 1 1 1 1 1 1 1 0 1 0 1 1 1]

Figure 18:
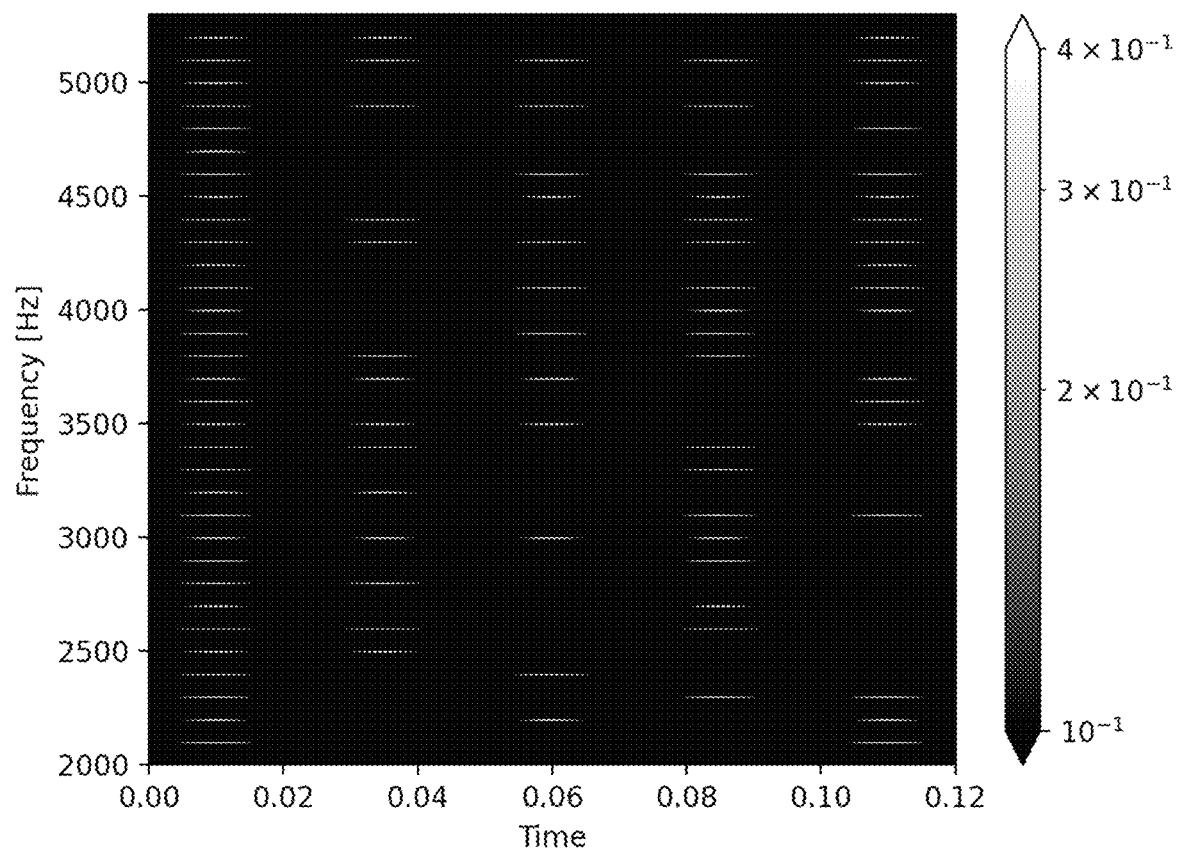
FIG. 18 illustrates an example of a placement of energy pulses within an analytical spectrogram to synthesize and encode a data packet of information.
Figure 19:
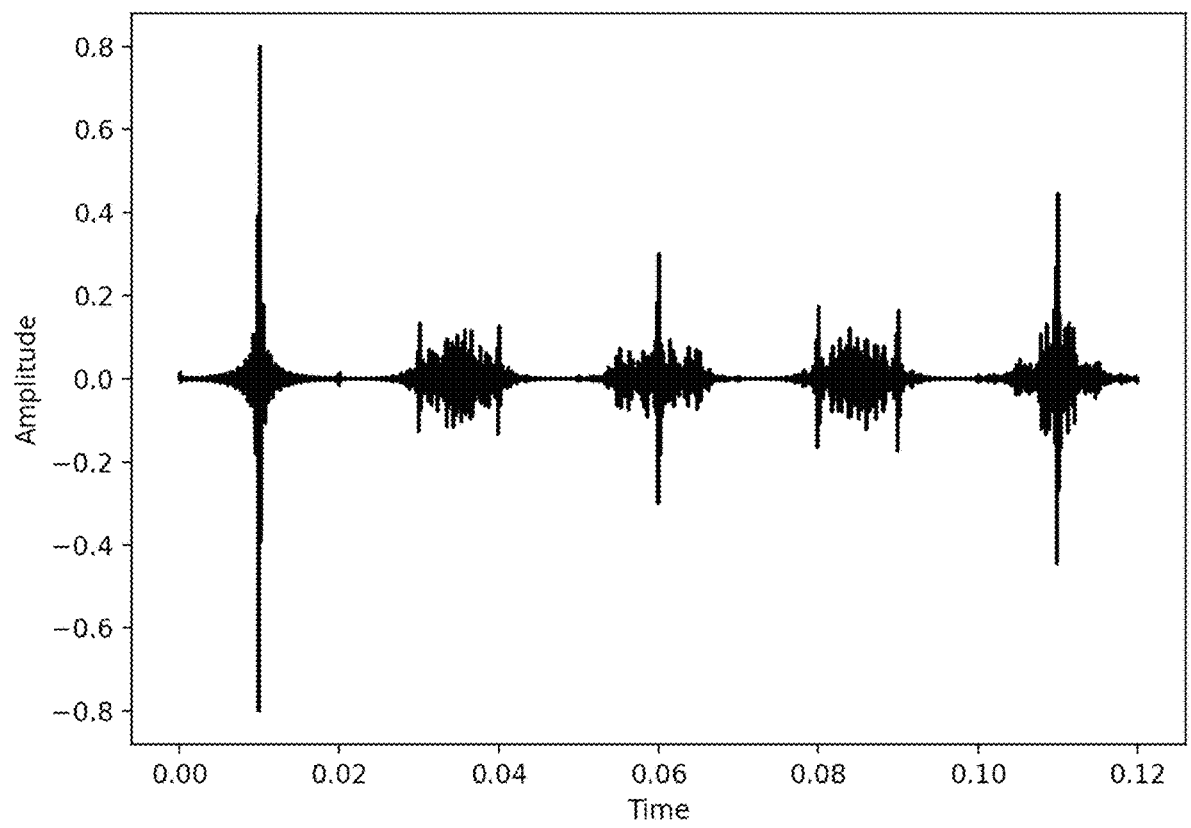
FIG. 19 illustrates an example of a resulting analytical signal containing a data packet to transmit information.
Figure 20:
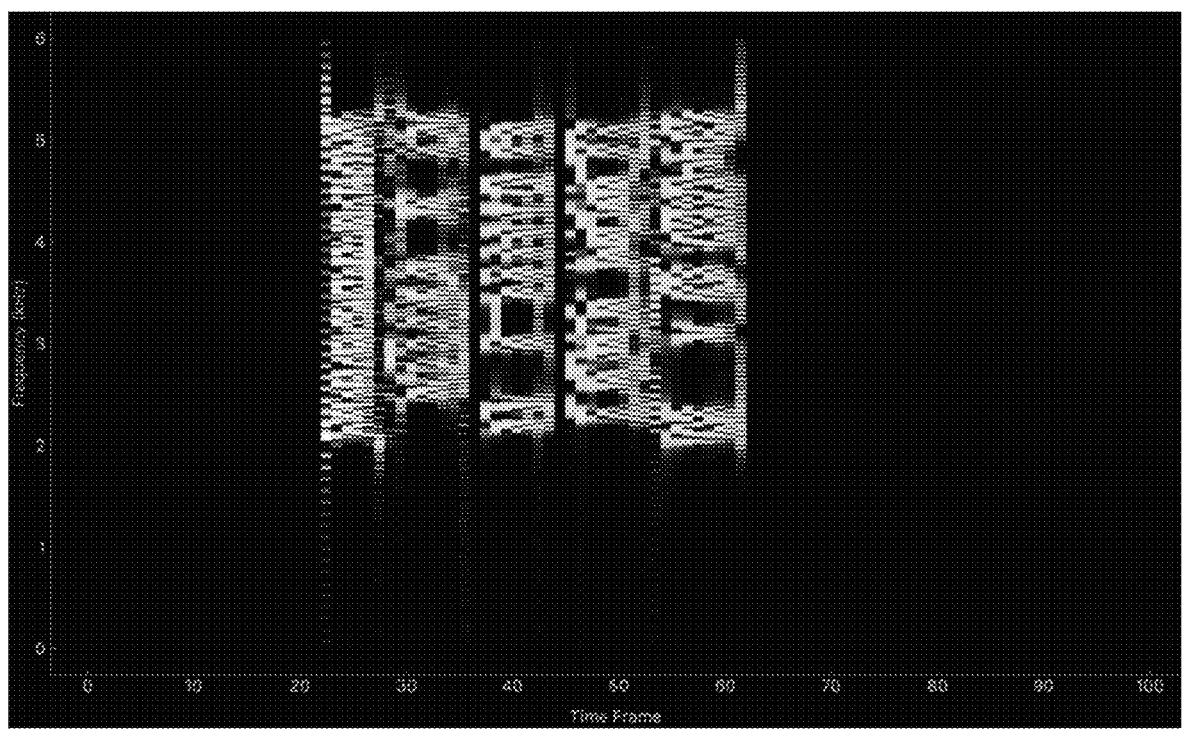
FIG. 20 illustrates an example of a decoded data packet within a digital spectrogram.

These data packets are first defined and constructed as energy pulses within the analytical spectrogram as shown in FIG. 18 with specific median and standard deviation values in both time and frequency. All pulse-bits within each packet are oriented vertically in frequency across the frequency band and are spaced consistently in time spanning and interval of $\Delta t \approx 0.08$ [sec]. Each individual bit synthesized within the analytical spectrogram is visually analogous to that shown on FIG. 7. FIG. 19 presents a section of the packet signal spanning $\Delta t \approx 0.02$ [sec] of the entire packet signal. FIG. 20 presents the resulting digital spectrogram constructed using $$T = \frac{1}{44,100} \left[ \frac{\text{seconds}}{\text{sample}} \right],$$

M=44,100 [samples/window] and $\Delta m=128$ [samples]. The digital spectrogram shown on FIG. 20 can by analyzed using the codec to decode the bit information received.

This example demonstrates a bit rate of $C_B \approx 1,600$ [bits/sec] which is approximately 0.25 of the theoretical maxima of the conventional serial methodology. This example serves to qualitatively display how bit information can be packaged and extracted from a signal; however, alternative arrangements of bits may be employed, and higher levels of data transfer can be achieved.

Figure 21:
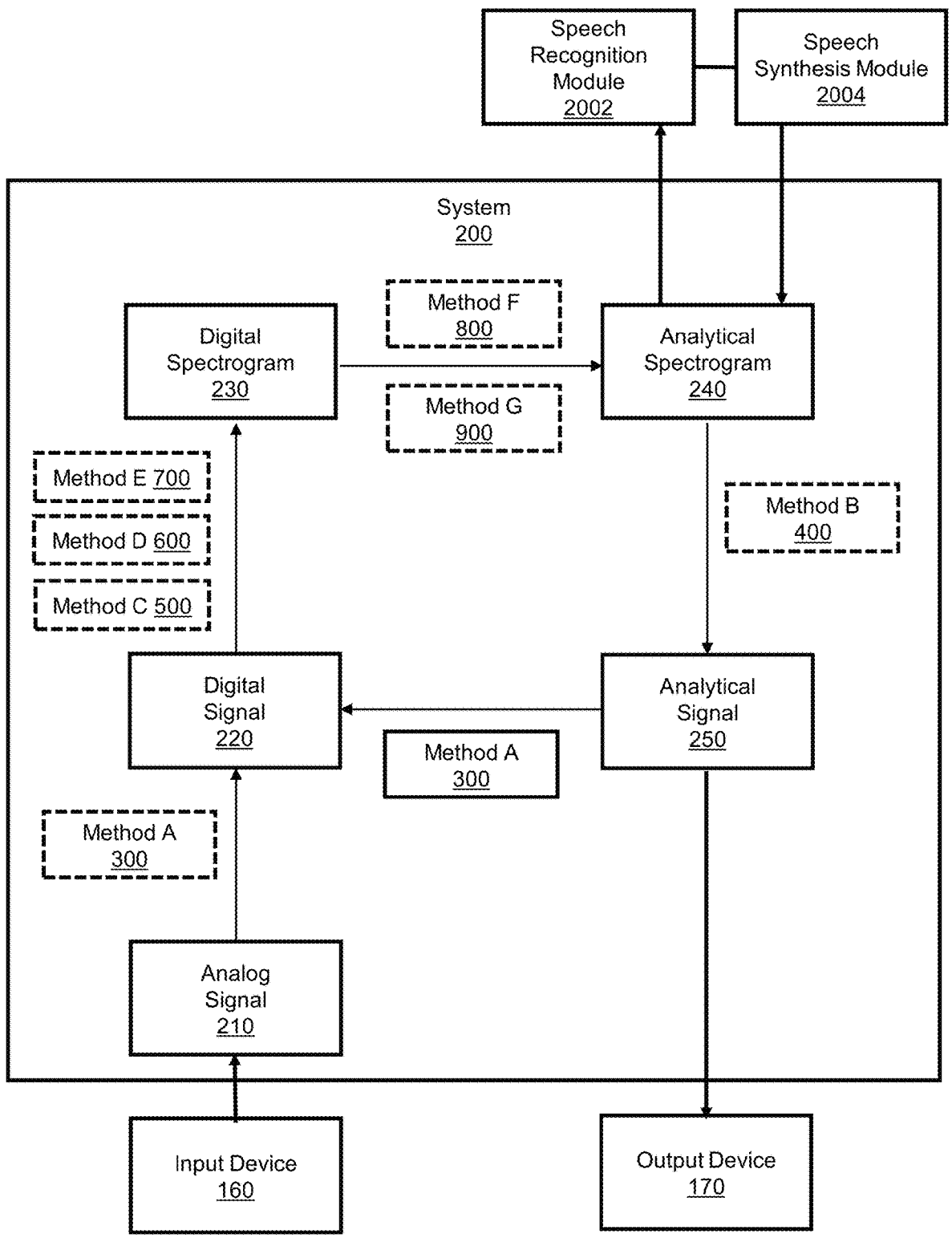
FIG. 21 is a schematic diagram representing an example of the system of FIG. 2 for speech synthesis.

The signal and spectrogram analysis techniques outlined herein have widespread application to human speech analysis, recognition, and synthesis. As exemplified in the flow chart of the example of FIG. 21, the present embodiments can be used for speech recognition; for example, using a speech recognition module 2002 and a speech synthesis module 2004. This example could include: receiving an analog signal from a human speaker with a microphone as the input device 160 which is then directed by input interface 106 into input module 120 for further processing within the programmable modules 200; sampling the analog signal into a digital signal (in accordance with the Method 300); windowing the digital signal for spectral analysis (in accordance with the Method 500); evaluating the Fourier transform of each window and estimating a discrete time derivative (in accordance with the Method 600); performing phase adjustment of the discrete derivative (in accordance with the Method 700) to construct a digital spectrogram representation of the digital signal; identifying where energy pulses that span time and frequency may exist; and then employing a speech recognition module 2002 to recognize energy pulse patterns of phonetic sounds within the analytical spectrogram by comparison to a phonetic database. In some cases, this can be used to replicate the received analog signal in order to capture the characteristics of the speech segment by: converting the digital spectrogram to a trial analytical spectrogram (in accordance with the Method 900); employing the speech synthesis module 2004 to modify the location, scale, shape and amplitude of energy pulses within the trial analytical spectrogram for the purpose of intonation, phrasing or other desired expression; inverting the trial analytical spectrogram into a trial analytical signal (in accordance with the Method 400) that closely approximates the received analog signal; and, sampling the trial analytical signal into a digital signal (in accordance with the Method 300) for further analysis as part of an iterative control loop for the purpose of minimizing the difference between the synthesized trial analytical and input analog signals. The resulting analytical spectrogram representation of the human speech segment allows for synthesis of a signal with similar vocal characteristics to the human speaker.

Figure 22:
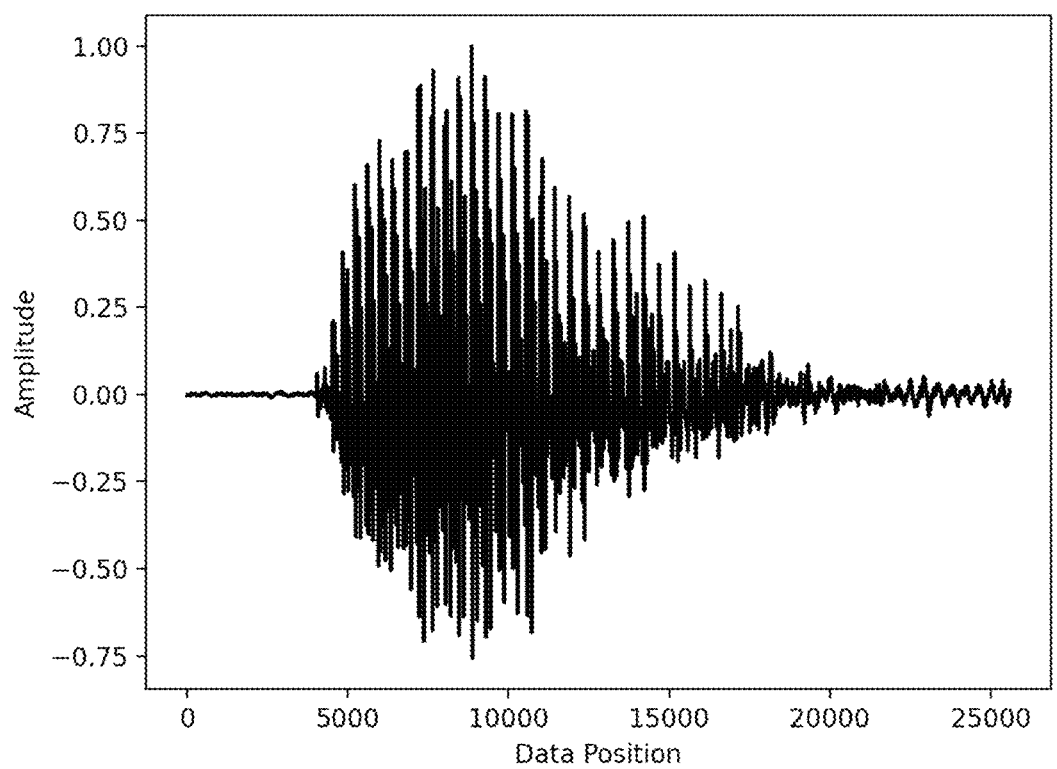
FIG. 22 illustrates an example of an input digital signal of the spoken word "are".
Figure 23:
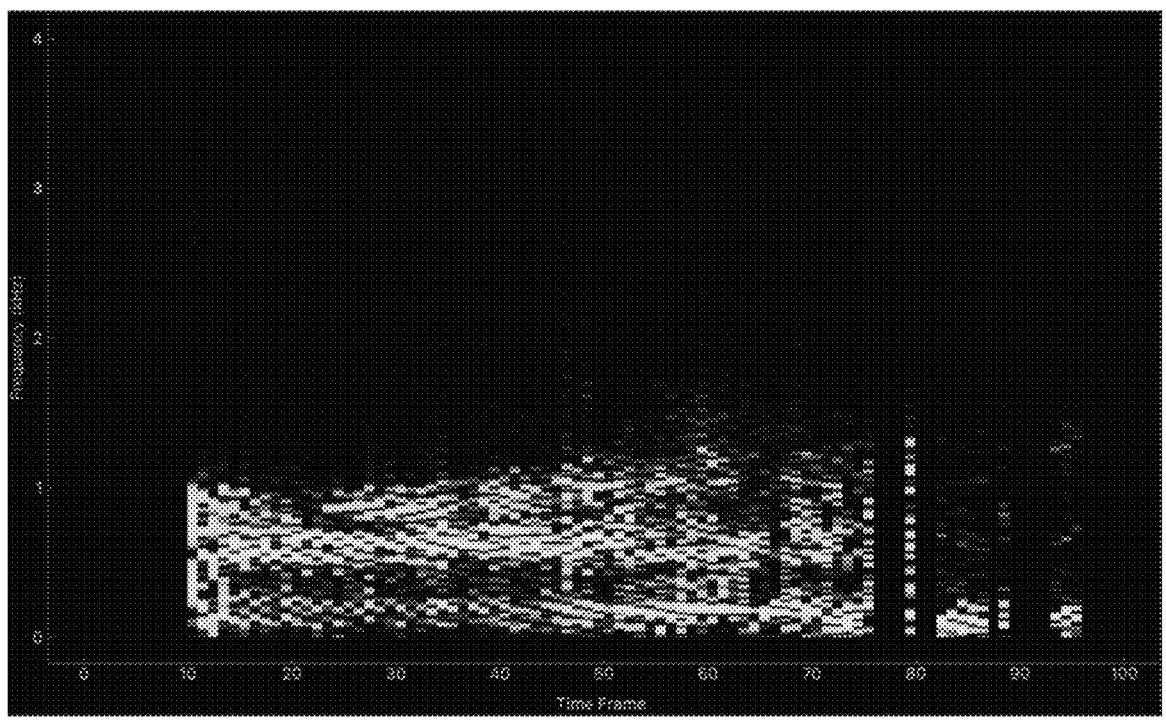
FIG. 23 illustrates an example of a digital spectrogram representing the spoken word "are".
Figure 24:
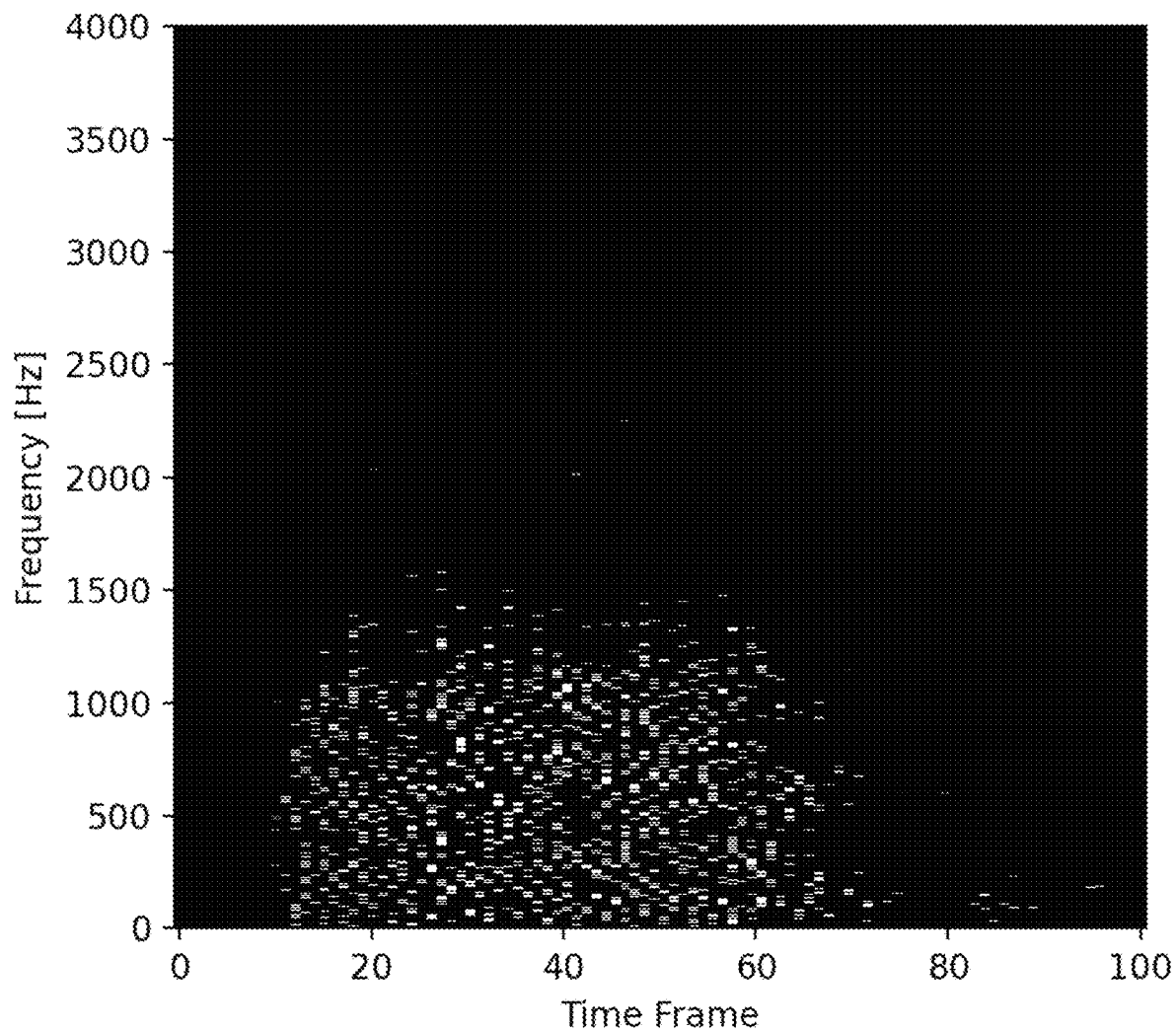
FIG. 24 illustrates an example of a location of peaks of all of energy pulses within a digital spectrogram that comprise the spoken word "are" for the purpose of generating a trial analytical spectrogram.
Figure 25:
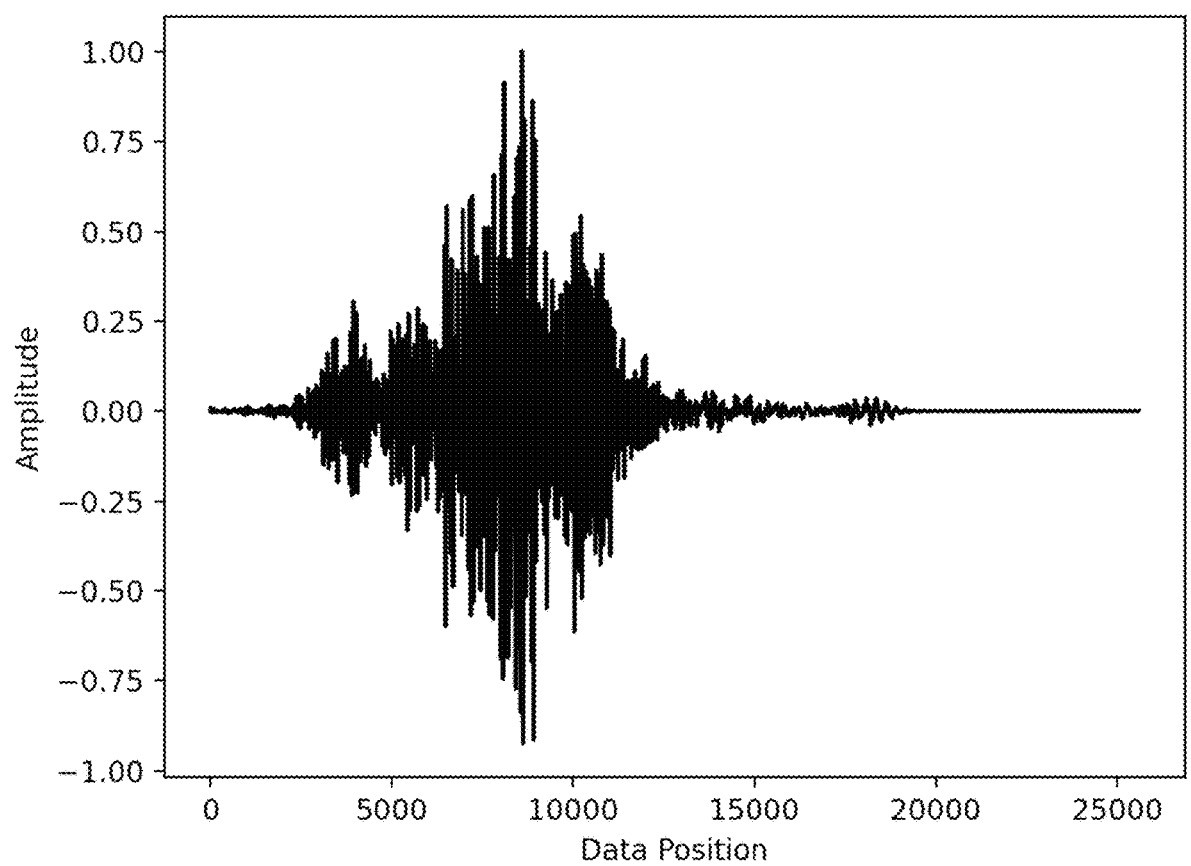
FIG. 25 illustrates an example of a trial analytical signal of the spoken word "are" generated with an initial guess of standard deviation values for the energy pulses identified in FIG. 24.

For ease of exposition, demonstration of the noise filter (in accordance with the Method 800) is provided in the following use case example. The example begins, in accordance with the Method 300, with a digital microphone (input device 160) recording of a human speech segment of the word/phoneme "are" as shown on FIG. 22. The signal has a sampling rate of $$T = \frac{1}{44,100}\left[\frac{\text{seconds}}{\text{sample}}\right]$$

and its amplitude is normalized between values of ±1. Method 500, Method 600, and Method 700 are sequentially performed to construct the digital spectrogram shown on FIG. 23 where M=44,100 [samples/window] and Δm=256 [samples]. The Method 900 is then utilized to evaluate the time and frequency location as well as the amplitude of the peak positions within the digital spectrogram by applying a form of persistent homology. FIG. 24 presents the peaks detected in the speech segment analysis which will be used to transform the digital spectrogram into a trial analytical spectrogram by synthesizing analytical energy pulses as parametric probability density functions at these local maxima. Once the trial analytical spectrogram is set with some initial standard deviation values ($\sigma_t$, $\sigma_\omega$), the analysis can produce a digital signal that approximates the original recording. FIG. 25 presents the trial digital signal that results from the initial guess of the trial analytical spectrogram for the conditions that all energy pulses are assigned $\sigma_t$=0.2 [sec] and $\sigma_\omega$=10 [Hz]. The trial digital signal obtained using the initial guess parameters is qualitatively like the input voice recording of the word "are" and substantially sounds like the original speaker. This implies that the location, scale, shape, and amplitude of the energy pulses are reasonably approximated without further parameter estimation. In some cases, the approach can further perform least squares analysis to optimally parameterize the location, scale, and shape of the energy pulses within the trial analytical spectrogram such that the difference between the trial digital signal and the input digital signal are minimized.

Advantageously, accurately reproducing human speech patterns using parametric functions provides the opportunity to adjust the patterns to effect various changes to the original signal. This approach allows for an advanced investigation into the characteristics of human speech and provides context for artificially generated human-sounding speech patterns.

The signal and spectrogram analysis techniques outlined herein have widespread application to ambient or background noise filtering of various signals including, but not limited to, human speech. Speech recognition can be used to identify background noise within an input signal, quantify the energy contribution of the background noise as being distinct from energy contribution of the relevant information, remove the background noise while retaining the relevant information, and generate an analytical signal that comprises the human speech element without the ambient noise contribution. The present embodiments have particular importance to speech recognition and spectrogram pattern analysis in noisy environments, such as a vehicle in operation.

Figure 26:
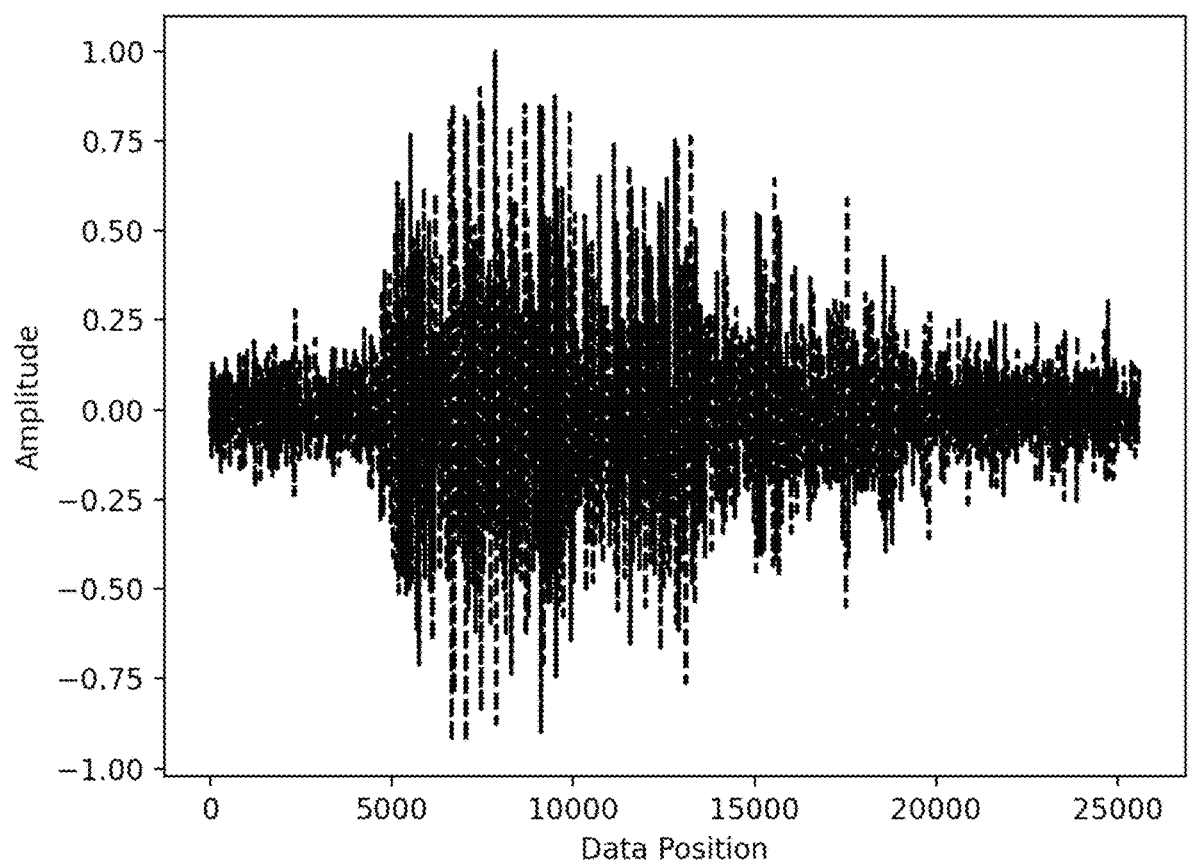
FIG. 26 illustrates an example of an input digital signal of the spoken word "are" combined with automobile background noise.
Figure 27:
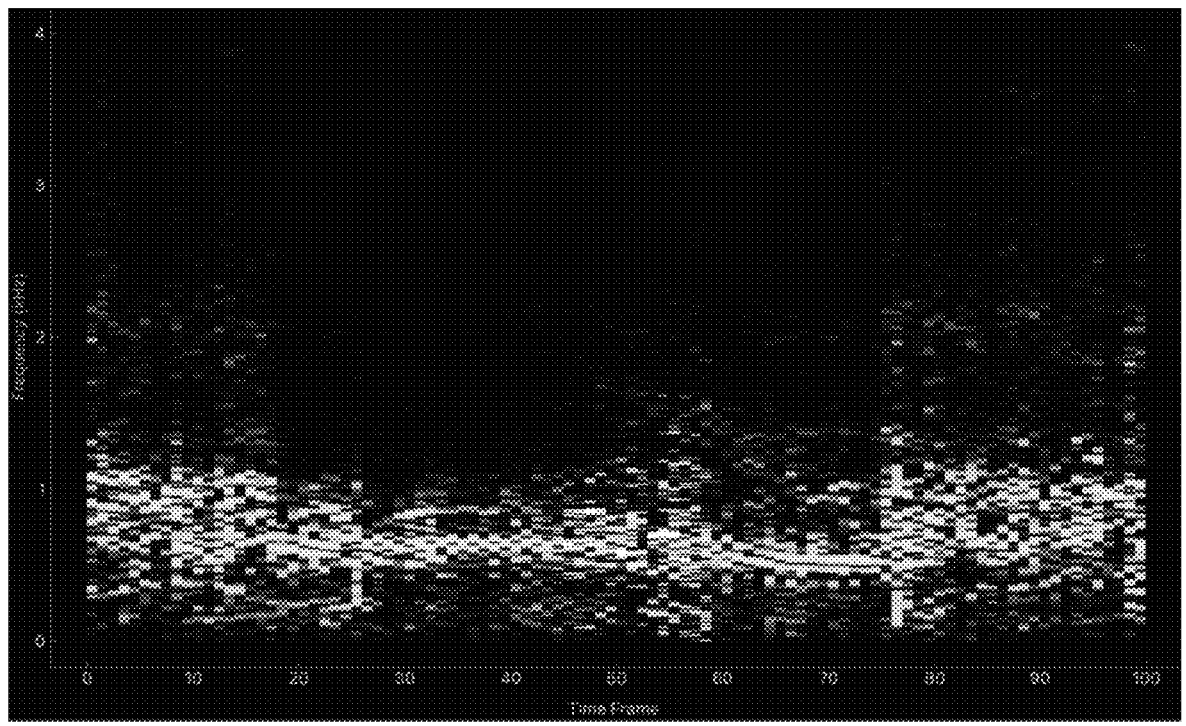
FIG. 27 illustrates an example of a digital spectrogram of the spoken word "are" combined with automobile background noise.

A controlled noisy environment can be generated to approximate the ambient sounds within a moving vehicle. The English phoneme "are" is spoken while the car sounds are playing in the background and is recorded by a microphone and digitally sampled as outlined in the Method 300. FIG. 26 presents the digital signal of the spoken word combined with the background noise. The digital signal is then processed using Method 500, Method 600, and Method 700 to produce a digital spectrogram. FIG. 27 presents the digital spectrogram with: the background noise occurring from the start of the recording to t≈0.4 [sec]. The background noise combined with the spoken word between 0.4≤t≤0.85 [sec]; and, returning to only background noise until the end of the recoding.

Figure 28:
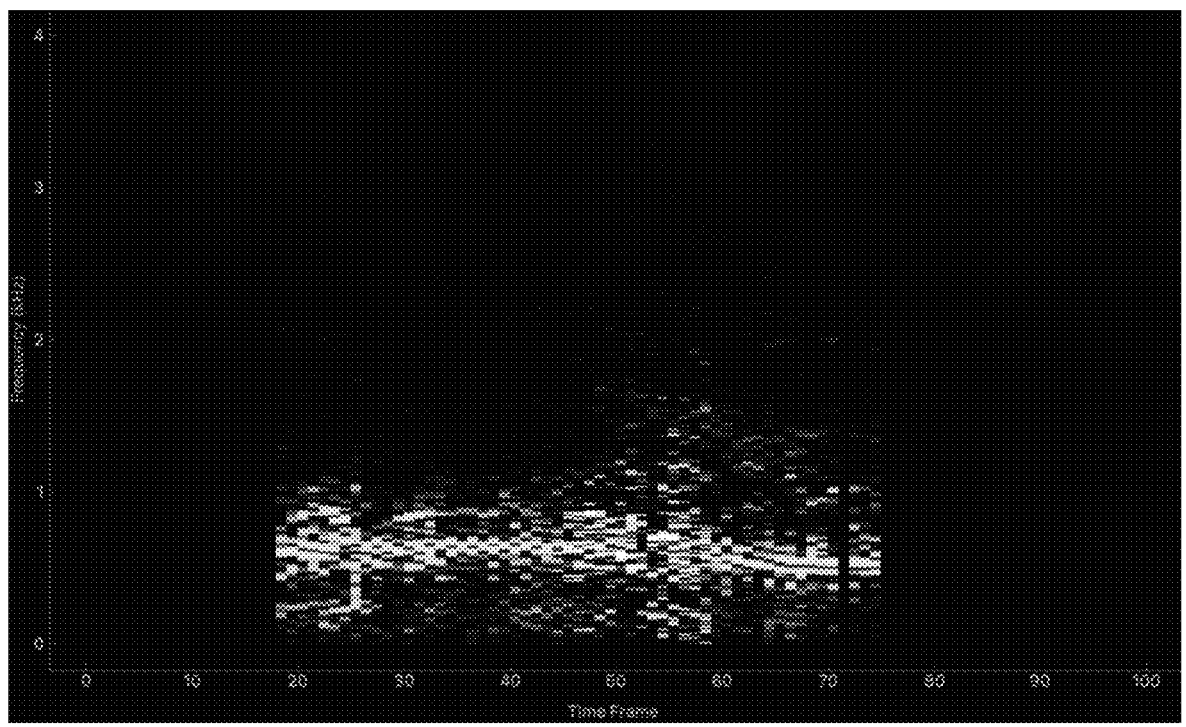
FIG. 28 illustrates an example of a digital spectrogram of the spoken word "are" after application of a noise filter.
Figure 29:
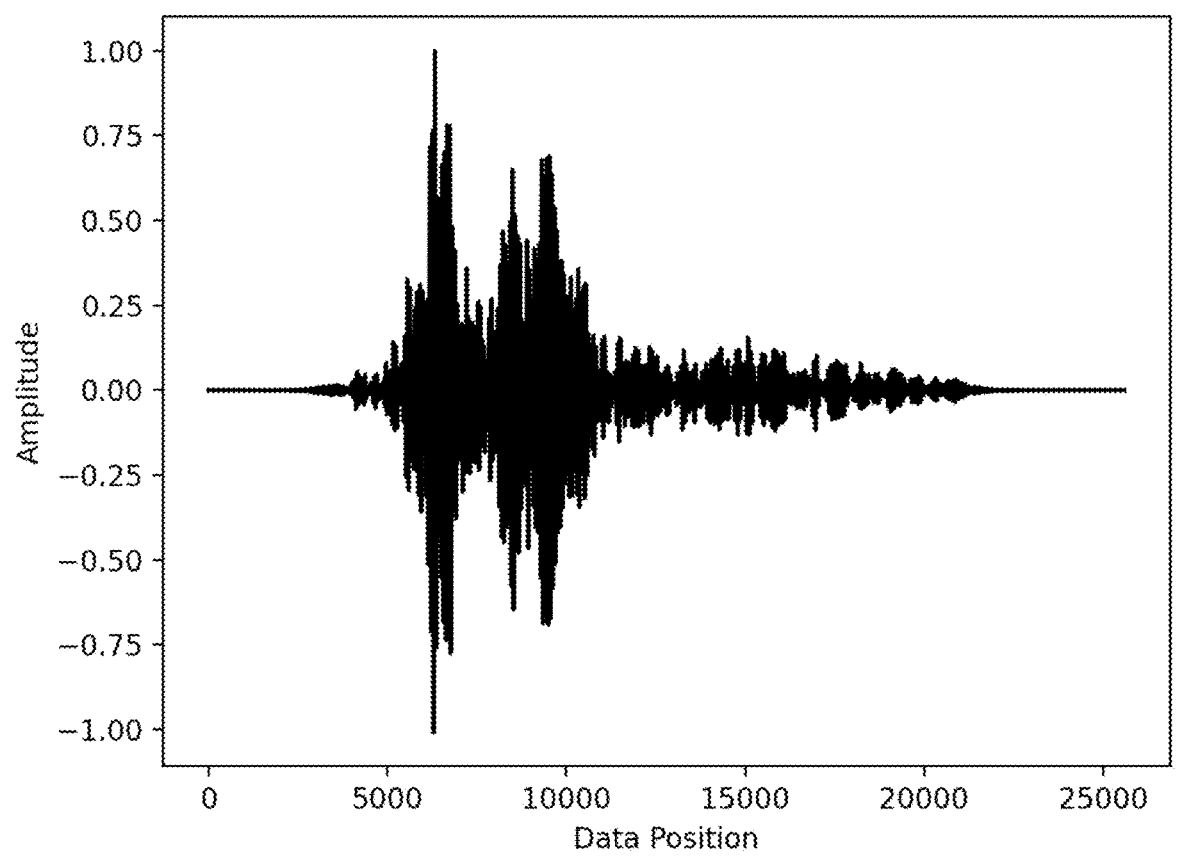
FIG. 29 illustrates an example of an analytical signal of the spoken word "are" after application of the noise filter.

Method 800 is employed to remove the background noise and isolate the energy signature of the spoken word using a noise threshold function $\Psi_k$. First, the interval of from the start of the recording to t≈0.4 [sec] was determined to contain only background car noise, as the summative energy in the associated time frames was below the threshold energy $\Psi_k$. Second, the rolling average $\gamma_k$ of the ambient energy was determined by evaluating the spectrogram energy signature $\mathcal{F}_{\ell,k}$ for a given frequency index k obtained over the succession of window indices $\ell$ within those time frames identified as having background noise. Therefore, $\gamma_k$ was evaluated as a function of frequency $\omega_k$. Third, the noise threshold function $\gamma_k$ was subtracted from the digital spectrogram in all positions with energy contributions from both spoken word and ambient noise using Equation (31) and generating $\tilde{\mathcal{F}}_{\ell,k}$, with the result being depicted on FIG. 28. Then, the Method 900 was used to convert the digital spectrogram into an analytical spectrogram. In some instances, the pattern of information given by $\tilde{\mathcal{F}}_{\ell,k}$ could be used by a machine learning algorithm for the purposes of voice recognition without being confounded by energy patterns representing background or ambient noise. Finally, the Method 400 was used to generate the analytical signal shown on FIG. 29 as well as other outputs such as a text transcription of recognized voice information.

Although the invention has been described with reference to certain specific embodiments, various modifications thereof will be apparent to those skilled in the art without departing from the spirit and scope of the invention as outlined in the claims appended hereto.

The invention claimed is:

1. A method of generating an analytical signal for signal analysis, the method executable on one or more computer processors, the method comprising:
   receiving a time-dependent digital signal;
   sectioning the time-dependent digital signal into a series of overlapping windows in time domain;
   generating a plurality of energy pulses by evaluating a function that quantifies energy information within each window or set of windows; and
   generating a time-dependent analytical signal by:
      generating an oscillating signal by multiplying each of the plurality of energy pulses by an oscillating function; and
      integrating the oscillating function across a band pass frequency filter.

2. The method of claim 1, wherein the analytical signal is defined by a set of parameters including time units, frequency units, origin, and range of energy pulse information to be included.

3. The method of claim 2, wherein the band pass frequency filter has a frequency range corresponding to the energy pulse information to be included.

4. The method of claim 1, wherein the time-dependent analytical signal is invertible to approximate the time-dependent digital signal.

5. The method of claim 4, wherein the time-dependent digital signal is generated by discretely sampling an input signal, the input signal being either an analog signal or the analytical signal, wherein the amplitude of each sample is the average energy information of the input signal over a predefined observation time interval.

6. The method of claim 1, wherein the function has as its peak a median position and monotonically tends to zero at a finite time and frequency interval from the median position.

7. The method of claim 6, wherein the function is one of: a parametric probability density function, a single or set of square functions, and a single or set of triangular functions.

8. The method of claim 1, wherein the oscillating function comprises a sine wave having a form of $\sin(2\pi\omega + \lambda)$, where $\lambda$ is a phase shift variable relative to an absolute time origin, $\omega$ is a frequency variable, and $t$ is a time variable.

9. The method of claim 1, wherein sectioning the time-dependent digital signal allows for identifying, quantifying, and mitigating background/ambient noise from the digital signal prior to evaluating the function.

10. The method of claim 1, further comprising:
    obtaining the analytical signal;
    sampling the analytical signal to convert the analytical signal into a generated digital signal;
    sectioning the generated digital signal into a series of overlapping windows;
    determining a discrete forward Fourier transform of the generated digital signal in each window; and
    arranging the Fourier transform of each window into a discrete time-frequency energy spectrogram.

11. A system for generating an analytical signal for signal analysis, the system comprising one or more processors and one or more computer storage media, the one or more computer storage media causing the one or more processors to execute a set of programmable modules configured to:
    receive a time-dependent digital signal;
    section the time-dependent digital signal into a series of overlapping windows in time domain;
    generating a plurality of energy pulses by evaluating a function that quantifies energy information within each window or set of windows; and
    generate a time-dependent analytical signal by:
       generating an oscillating signal by multiplying each of the plurality of energy pulses by an oscillating function; and
       integrating the oscillating function across a band pass frequency filter.

12. The system of claim 11, wherein the analytical signal is defined by a set of parameters including time units, frequency units, origin and range of energy pulse information to be included.

13. The system of claim 12, wherein the band pass frequency filter has a frequency range corresponding to the energy pulse information to be included.

14. The system of claim 12, wherein sectioning the time-dependent digital signal identifies, quantifies, and mitigates background/ambient noise from the digital signal prior to evaluation of the function.

15. The system of claim 11, wherein the time-dependent analytical signal is invertible to approximate the time-dependent digital signal.

16. The system of claim 15, wherein the time-dependent digital signal is generated by discretely sampling an input signal, the input signal being either an analog signal or the analytical signal, wherein the amplitude of each sample is the average energy information of the input signal over a predefined observation time interval.

17. The system of claim 11, wherein the function has as its peak a median position and monotonically tends to zero at a finite time and frequency interval from the median position.

18. The system of claim 17, wherein the function is one of: a parametric probability density function, a single or set of square functions, and a single or set of triangular functions.

19. The system of claim 11, wherein the oscillating function comprises a sine wave having a form of $\sin(2\pi\omega t + \lambda)$, where $\lambda$ is a phase shift variable relative to an absolute time origin, $\omega$ is a frequency variable, and $t$ is a time variable.

20. The system of claim 11, wherein the programmable modules are further configured to:
    obtain the analytical signal;
    sample the analytical signal to convert the analytical signal into a generated digital signal;
    section the generated digital signal into a series of overlapping windows;
    determine a discrete forward Fourier transform of the generated digital signal in each window; and
    arrange the Fourier transform of each window into a discrete time-frequency energy spectrogram.

* * * * *